United States Patent
Kaur et al.

(10) Patent No.: US 10,042,259 B2
(45) Date of Patent: Aug. 7, 2018

(54) TOPCOAT COMPOSITIONS AND PATTERN-FORMING METHODS

(71) Applicant: Rohm and Haas Electronic Materials LLC, Marlborough, MA (US)

(72) Inventors: Irvinder Kaur, Northborough, MA (US); Cong Liu, Shrewsbury, MA (US); Doris Kang, Shrewsbury, MA (US); Mingqi Li, Shrewsbury, MA (US); Deyan Wang, Hudson, MA (US); Huaxing Zhou, Furlong, PA (US)

(73) Assignee: Rohm and Haas Electronic Materials LLC, Marlborough, MA (US)

(*) Notice: Subject to any disclaimer, the term of this patent is extended or adjusted under 35 U.S.C. 154(b) by 0 days.

(21) Appl. No.: 15/730,876

(22) Filed: Oct. 12, 2017

(65) Prior Publication Data
US 2018/0118970 A1 May 3, 2018

Related U.S. Application Data

(60) Provisional application No. 62/415,394, filed on Oct. 31, 2016.

(51) Int. Cl.

| | |
|---|---|
| *G03F 7/11* | (2006.01) |
| *C08F 20/34* | (2006.01) |
| *C08F 222/40* | (2006.01) |
| *C08L 33/16* | (2006.01) |
| *C09D 133/08* | (2006.01) |
| *C09D 133/10* | (2006.01) |
| *C09D 133/16* | (2006.01) |
| *G03F 7/00* | (2006.01) |
| *G03F 7/038* | (2006.01) |
| *G03F 7/039* | (2006.01) |
| *G03F 7/32* | (2006.01) |
| *H01L 21/027* | (2006.01) |

(52) U.S. Cl.
CPC ............. *G03F 7/11* (2013.01); *C08F 20/34* (2013.01); *C08F 222/40* (2013.01); *C08L 33/16* (2013.01); *C09D 133/08* (2013.01); *C09D 133/10* (2013.01); *C09D 133/16* (2013.01); *G03F 7/0002* (2013.01); *G03F 7/0382* (2013.01); *G03F 7/0392* (2013.01); *G03F 7/327* (2013.01); *H01L 21/0274* (2013.01); *C08L 2205/025* (2013.01)

(58) Field of Classification Search
CPC . G03F 7/004; G03F 7/038; G03F 7/11; G03F 7/2041; C08F 20/34; C08F 222/40; H01L 21/0274
USPC ...................................................... 430/271.1
See application file for complete search history.

(56) References Cited

U.S. PATENT DOCUMENTS

| | | | | |
|---|---|---|---|---|
| 3,342,791 | A | * 9/1967 | Kelley | .............. C08F 20/34 526/265 |
| 5,059,513 | A | * 10/1991 | Hopf | .............. G03F 7/0045 430/192 |
| 2007/0087286 | A1 | 4/2007 | Wang et al. | |
| 2007/0212646 | A1 | 9/2007 | Gallagher et al. | |

(Continued)

OTHER PUBLICATIONS

Sanders, et al, "Self-segregating materials for immersion lithography", Advances in Resist Materials and Processing Technology XXV, Proc. of SPIE, 2008, pp. 692309-1-692309-12, vol. 6923.
Co-pending U.S. Appl. No. 15/297,556, filed Oct. 19, 2016.
Co-pending U.S. Appl. No. 15/297,545, filed Oct. 19, 2016.

*Primary Examiner* — Amanda C. Walke
(74) *Attorney, Agent, or Firm* — Jonathan D. Baskin

(57) ABSTRACT

Topcoat compositions comprise: a matrix polymer; a surface active polymer comprising a polymerized unit formed from a monomer of the following general formula (I):

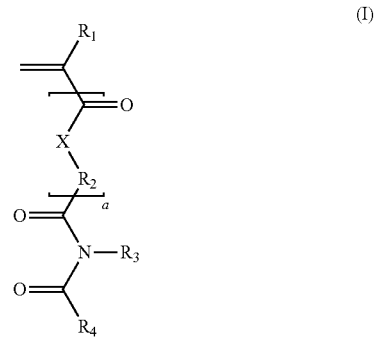

wherein: $R_1$ represents H, F, methyl or fluorinated methyl; $R_2$ represents optionally substituted C1 to C8 alkylene or optionally substituted C1 to C8 fluoroalkylene, optionally comprising one or more heteroatom; $R_3$ represents H, F, optionally substituted C1 to C10 alkyl or optionally substituted C5 to C15 aryl, optionally comprising one or more heteroatom; $R_4$ represents optionally substituted C1 to C8 alkyl, optionally substituted C1 to C8 fluoroalkyl or optionally substituted C5 to C15 aryl, optionally comprising one or more heteroatom; X represents O, S or $NR_5$, wherein $R_5$ is chosen from hydrogen and optionally substituted C1 to C5 alkyl; and a is 0 or 1; and a solvent. Also provided are coated substrates and pattern-forming methods which make use of the topcoat compositions. The invention has particular applicability in photolithographic processes as a photoresist topcoat layer in the manufacture of semiconductor devices.

18 Claims, No Drawings

(56) References Cited

U.S. PATENT DOCUMENTS

| | | |
|---|---|---|
| 2010/0183976 A1 | 7/2010 | Wang et al. |
| 2014/0287361 A1* | 9/2014 | Nakamura ............ G03F 7/0397 430/281.1 |
| 2014/0287362 A1* | 9/2014 | Nakamura ............ G03F 7/0382 430/281.1 |
| 2016/0122574 A1* | 5/2016 | Lee ........................ G03F 7/091 524/516 |
| 2016/0130462 A1* | 5/2016 | Liu ...................... C09D 133/16 430/325 |

* cited by examiner

TOPCOAT COMPOSITIONS AND PATTERN-FORMING METHODS

This application claims the benefit of priority under 35 U.S.C. § 119(e) to U.S. Provisional Application No. 62/415,394, filed Oct. 31, 2016, the entire contents of which are incorporated herein by reference.

FIELD

This invention relates to topcoat compositions that may be applied above a photoresist composition in a photolithographic process. The invention further relates to coated substrates and methods of forming patterns using the topcoat compositions. The invention finds particular applicability in the semiconductor manufacturing industry for forming semiconductor devices.

BACKGROUND

One approach to achieving nanometer (nm)-scale feature sizes in semiconductor devices is to use shorter wavelengths of light when exposing photoresist layers. However, the difficulty in finding materials that are transparent below 193 nm exposure wavelength has led to the immersion lithography process to increase the numerical aperture of the lens by use of a liquid to focus more light into the film. Immersion lithography employs a relatively high refractive index fluid between the last surface of an imaging device (e.g., KrF or ArF light source) and the first surface on the substrate, for example, a semiconductor wafer.

In immersion lithography, direct contact between the immersion fluid and photoresist layer can result in leaching of components of the photoresist into the immersion fluid. This leaching can cause contamination of the optical lens and bring about a change in the effective refractive index and transmission properties of the immersion fluid. In an effort to ameliorate this problem, use of a topcoat layer over the photoresist layer as a barrier between the immersion fluid and underlying photoresist layer has been proposed. The use of topcoat layers in immersion lithography, however, presents various challenges. Topcoat layers can impact, for example, process window, critical dimension (CD) variation, resist profile and device failure due to coating defects such as dewetting defects.

To improve performance of topcoat materials, the use of self-segregating topcoat compositions to form a graded topcoat layer has been proposed, for example, in *Self-segregating Materials for Immersion Lithography*, Daniel P. Sanders et al., Advances in Resist Materials and Processing Technology XXV, Proceedings of the SPIE, Vol. 6923, pp. 692309-1-692309-12 (2008). A self-segregated topcoat would theoretically allow for a tailored material having desired properties at both the immersion fluid and photoresist interfaces, for example, an improved water receding contact angle at the immersion fluid interface and good developer solubility at the photoresist interface.

Topcoats exhibiting a low receding contact angle for a given scan speed can result in water mark defects. These defects are generated when water droplets are left behind as the exposure head moves across the wafer. As a result, resist sensitivity becomes altered due to leaching of resist components into the water droplets, and water can permeate into the underlying resist. Topcoats having high receding contact angles would therefore be desired to allow for operation of immersion scanners at greater scan speeds, thereby allowing for increased process throughput. U.S. Patent App. Pub. Nos. 2007/0212646A1 to Gallagher et al. and 2010/0183976A1 to Wang et al. describe immersion topcoat compositions that include a self-segregating surface active polymer which allow for improved water receding contact angles.

The inventors have found that focusing on increasing topcoat receding contact angle and scan speed alone can prove detrimental to the formed devices. While greater topcoat polymer hydrophobicity can result in a higher receding contact angle, it can also result in increased occurrence of coating defects, for example, dewets in the form of spike-shaped discontinuities in the topcoat layer and surface roughness of the layer. It therefore would be desired to have a topcoat composition that would provide satisfactory contact angle and developer dissolution rate properties to allow for high scan speeds while also minimizing coating defects.

There is a continuing need in the art for topcoat compositions that address one or more problems associated with the state of the art, and for pattern-forming methods making use of such materials.

SUMMARY

In accordance with a first aspect of the application, provided are topcoat compositions. The topcoat compositions comprise: a matrix polymer; a surface active polymer comprising a polymerized unit formed from a monomer of the following general formula (I):

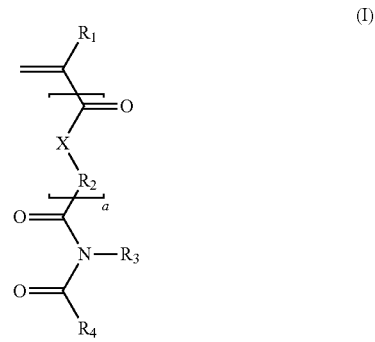

wherein: $R_1$ represents H, F, methyl or fluorinated methyl; $R_2$ represents optionally substituted C1 to C8 alkylene or optionally substituted C1 to C8 fluoroalkylene, optionally comprising one or more heteroatom; $R_3$ represents H, F, optionally substituted C1 to C10 alkyl or optionally substituted C5 to C15 aryl, optionally comprising one or more heteroatom; $R_4$ represents optionally substituted C1 to C8 alkyl, optionally substituted C1 to C8 fluoroalkyl or optionally substituted C5 to C15 aryl, optionally comprising one or more heteroatom; X represents O, S or $NR_5$, wherein $R_5$ is chosen from hydrogen and optionally substituted C1 to C5 alkyl; and a is 0 or 1; and a solvent. The topcoat compositions have particular applicability in photolithographic processes as a photoresist topcoat layer in the manufacture of semiconductor devices, with particular applicability in immersion lithography.

Also provided are coated substrates, comprising: a photoresist layer on a substrate; and a topcoat layer formed from a topcoat composition as described herein on the photoresist layer.

Also provided are pattern-forming methods. The methods comprise: (a) forming a photoresist layer over a substrate;

(b) forming a topcoat layer over the photoresist layer, wherein the topcoat layer is formed from a topcoat composition as described herein; (c) exposing the topcoat layer and the photoresist layer to activating radiation; and (d) contacting the exposed topcoat layer and photoresist layer with a developer to form a photoresist pattern. In a preferred aspect, the exposing is conducted by immersion lithography.

Various materials and groups that are "optionally substituted" may be suitably substituted at one or more available positions, typically at a position otherwise occupied by a hydrogen atom. Except as otherwise specified, "substituted" shall be understood to mean including at least one non-hydrogen substituent such as a halogen (i.e., F, Cl, Br, I), hydroxyl, amino, thiol, carboxyl, carboxylate, ester, ether, amide, nitrile, sulfide, disulfide, nitro, $C_{1-18}$ alkyl, $C_{1-18}$ alkenyl (including norbornenyl), $C_{1-18}$ alkoxyl, $C_{2-18}$ alkenoxyl (including vinyl ether), $C_{4-18}$ aryl, $C_{6-18}$ aryloxyl, $C_{7-18}$ alkylaryl, or $C_{7-18}$ alkylaryloxyl, optionally including one or more heteroatom. As used herein: "Mw" means weight average molecular weight; "Mn" means number average molecular weight; "PDI" means polydispersity index=Mw/Mn; "copolymer" is inclusive of polymers containing two or more different types of polymerized units; "alkyl," "alkylene" and the like are inclusive of linear, branched and cyclic structures; and the articles "a" and "an" are inclusive of one or more unless otherwise indicated.

DETAILED DESCRIPTION

Topcoat Compositions

The topcoat compositions of the invention comprise a matrix polymer, a surface active polymer, a solvent, and can include one or more additional, optional components.

Topcoat compositions of the invention that are applied above a photoresist layer are self-segregating, and can minimize or prevent migration of components of the photoresist layer into an immersion fluid employed in an immersion lithography process. As used herein, the term "immersion fluid" means a fluid, typically water, interposed between a lens of an exposure tool and a photoresist coated substrate to conduct immersion lithography.

Also as used herein, a topcoat layer will be considered as inhibiting the migration of photoresist material into an immersion fluid if a decreased amount of acid or organic material is detected in the immersion fluid upon use of the topcoat composition relative to the same photoresist system that is processed in the same manner, but in the absence of the topcoat composition layer. Detection of photoresist material in the immersion fluid can be conducted through mass spectroscopy analysis of the immersion fluid before exposure to the photoresist (with and without the overcoated topcoat composition layer) and then after lithographic processing of the photoresist layer (with and without the overcoated topcoat composition layer) with exposure through the immersion fluid. Preferably, the topcoat composition provides at least a 10 percent reduction in photoresist material (e.g., acid or organics as detected by mass spectroscopy) residing in the immersion fluid relative to the same photoresist that does not employ any topcoat layer (i.e., the immersion fluid directly contacts the photoresist layer), more preferably the topcoat composition provides at least a 20, 50, or 100 percent reduction in photoresist material residing in the immersion fluid relative to the same photoresist that does not employ a topcoat layer.

Topcoat compositions of the invention can allow for improvement in one or more of various water contact angle characteristics that are important in an immersion lithography process, for example, static contact angle, receding contact angle, advancing contact angle and sliding angle at the immersion fluid interface. The topcoat layer compositions provide topcoat layers having excellent developer solubility for both exposed and unexposed regions of the layer, for example, in an aqueous base developer.

The compositions can be used in dry lithography or more typically in immersion lithography processes. The exposure wavelength is not particularly limited except by the photoresist compositions, with wavelengths of less than 300 nm, for example, 248 nm, 193 nm or an EUV wavelength (e.g., 13.4 or 13.5 nm) being typical. Use of the compositions in a 193 nm immersion lithography process is particularly preferred.

The topcoat compositions of the invention include two or more different polymers. Polymers useful in the invention may be homopolymers, but more typically include a plurality of distinct repeat units, with two or three distinct units, i.e., copolymers or terpolymers, being typical. The polymers are preferably aqueous alkali soluble such that a topcoat layer formed from the composition can be removed in the resist development step using an aqueous alkaline developer, for example, a quaternary ammonium hydroxide solution such as an aqueous tetra methyl ammonium hydroxide (TMAH) solution.

A variety of polymers may be employed in the topcoat compositions of the invention, including polymers comprising polymerized acrylate groups, polyesters, and other repeat units and/or polymer backbone structures such as provided by, for example, poly(alkylene oxide), poly(meth) acrylic acid, poly (meth)acrylamides, polymerized aromatic (meth)acrylates, and polymerized vinyl aromatic monomers. Typically, the polymers each include at least two differing repeat units. The different polymers suitably may be present in varying relative amounts.

The polymers of the topcoat compositions of the invention may contain a variety of repeat units, including, for example, one or more: hydrophobic groups; weak acid groups; strong acid groups; branched optionally substituted alkyl or cycloalkyl groups; fluoroalkyl groups; or polar groups, such as ester, ether, carboxy, or sulfonyl groups. The presence of particular functional groups on the repeat units of the polymers will depend, for example, on the intended functionality of the polymer.

In certain preferred aspects, one or more polymers of the coating composition will comprise one or more groups that are reactive during lithographic processing, for example, one or more photoacid-acid labile groups that can undergo cleavage reactions in the presence of acid and heat, such as acid-labile ester groups (e.g., t-butyl ester groups such as provided by polymerization of t-butyl acrylate or t-butyl-methacrylate, adamantylacrylate) and/or acetal groups such as provided by polymerization of a vinyl ether compound. The presence of such groups can render the associated polymer(s) more soluble in a developer solution, thereby aiding in developability and removal of the topcoat layer during a development process.

The polymers can advantageously be selected to tailor characteristics of the topcoat layer, with each generally serving one or more purpose or function. Such functions include, for example, one or more of photoresist profile adjusting, topcoat surface adjusting, reducing defects and reducing interfacial mixing between the topcoat and photoresist layers.

The matrix polymer may include one or more repeating units, with two repeating units being typical. The matrix polymer should provide a sufficiently high developer dissolution rate for reducing overall defectivity due, for example, to micro-bridging. The matrix polymer may include, for example, a sulfonamide-containing monomer for enhancing the polymer developer dissolution rate. A typical developer dissolution rate for the matrix polymer is greater than 300 nm/second, preferably greater than 500 nm/second. The matrix polymers can be fluorinated or non-fluorinated. For some photoresist materials, fluorinated topcoat matrix polymers can reduce or minimize interfacial mixing between the topcoat layer and underlying photoresist layer. Accordingly, one or more repeating unit of the matrix polymer can be fluorinated, for example, with a fluoroalkyl group such as a C1 to C4 fluoroalkyl group, typically fluoromethyl, and may be present, for example, as a sulfonamide group (e.g., —NHSO$_2$CF$_3$) or a fluoroalcohol group (e.g., —C(CF$_3$)$_2$OH).

The matrix polymer has a higher surface energy than that of, and is preferably immiscible with, the surface active polymer, to allow the surface active polymer to phase separate from the matrix polymer and migrate to the upper surface of the topcoat layer away from the topcoat photoresist interface. The surface energy of the matrix polymer is typically from 30 to 60 mN/m.

Exemplary matrix polymers in accordance with the invention include the following:

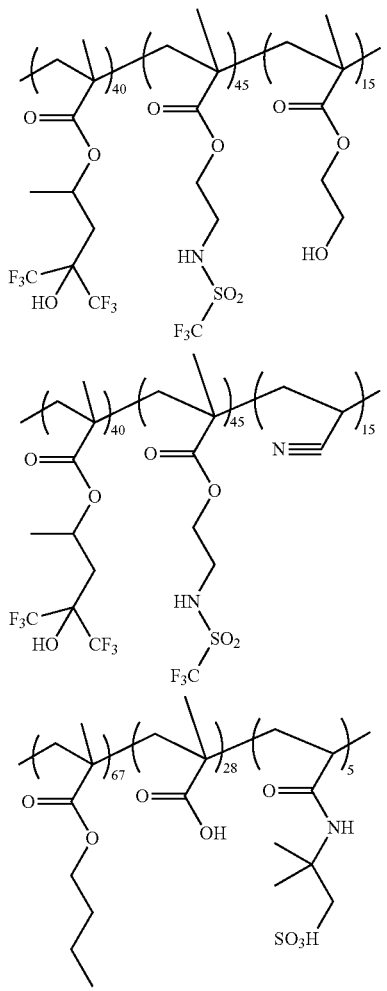

-continued

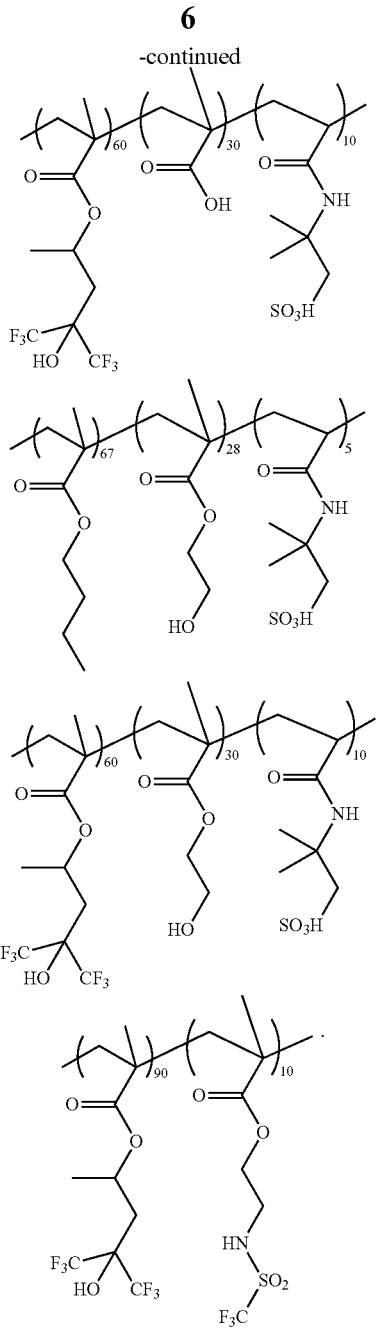

The matrix polymer is typically present in the compositions in an amount of from 70 to 99 wt %, more typically from 85 to 95 wt %, based on total solids of the topcoat composition. The weight average molecular weight of the matrix polymer is typically less than 400,000, for example, from 5000 to 50,000, from 5000 to 15,000 or from 5000 to 25,000 Daltons.

The surface active polymer is provided in the topcoat compositions to improve surface properties at the topcoat/immersion fluid interface. In particular, the surface active polymer beneficially can provides desirable surface properties with respect to water, for example, one or more of improved static contact angle (SCA), receding contact angle (RCA), advancing contact angle (ACA) and sliding angle (SA) at the topcoat/immersion fluid interface. In particular, the surface active polymer can allow higher RCAs, which can allow for faster scanning speeds and increased process throughput. A layer of the topcoat composition in a dried state typically has a water receding contact angle of from 60 to 90°, preferably from 70 to 90° and more preferably from 75 to 90°. The phrase "in a dried state" means containing 8 wt % or less of solvent, based on the entire composition.

The surface active polymer is preferably aqueous alkali soluble. The surface active polymer preferably has a lower surface energy than the matrix polymer. Preferably, the surface active polymer has a significantly lower surface energy than and is substantially immiscible with the matrix polymer, as well as other polymers present in the overcoat composition. In this way, the topcoat composition can be self-segregating, wherein the surface active polymer migrates to the upper surface of the topcoat layer apart from other polymers during coating. The resulting topcoat layer is thereby rich in the surface active polymer at the topcoat layer upper surface which, in the case of an immersion lithography process is at the topcoat/immersion fluid interface. While the desired surface energy of the surface active polymer will depend on the particular matrix polymer and its surface energy, the surface active polymer surface energy is typically from 25 to 35 mN/m, preferably from 25 to 30 mN/m. The surface active polymer is typically from 5 to 25 mN/m less than that of the matrix polymer, preferably from 5 to 15 mN/m less than that of the matrix polymer.

The surface active polymer includes a polymerized unit formed from a monomer of the following general formula (I):

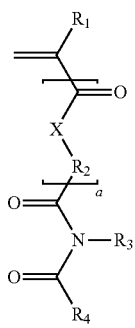

(I)

wherein: $R_1$ represents H, F, methyl or fluorinated methyl; $R_2$ represents optionally substituted C1 to C8 alkylene or optionally substituted C1 to C8 fluoroalkylene, optionally comprising one or more heteroatom; $R_3$ represents H, F, optionally substituted C1 to C10 alkyl or optionally substituted C5 to C15 aryl, optionally comprising one or more heteroatom; $R_4$ represents optionally substituted C1 to C8 alkyl, optionally substituted C1 to C8 fluoroalkyl or optionally substituted C5 to C15 aryl, optionally comprising one or more heteroatom; X represents O, S or $NR_5$, wherein $R_5$ is chosen from hydrogen and optionally substituted C1 to C5 alkyl; and a is 0 or 1; and a solvent.

In general formula (I), when a is 1, the surface active polymer can be made more hydrophobic to further lower the surface energy of the polymer. Use of a polymerized unit formed from a monomer of general formula (I) having an imide group, preferably a fluorinated imide group, in the additive polymer can provide improved dark field developer dissolution rate while maintaining a high receding contact angle.

Exemplary suitable monomers of general formula (I) include the following:

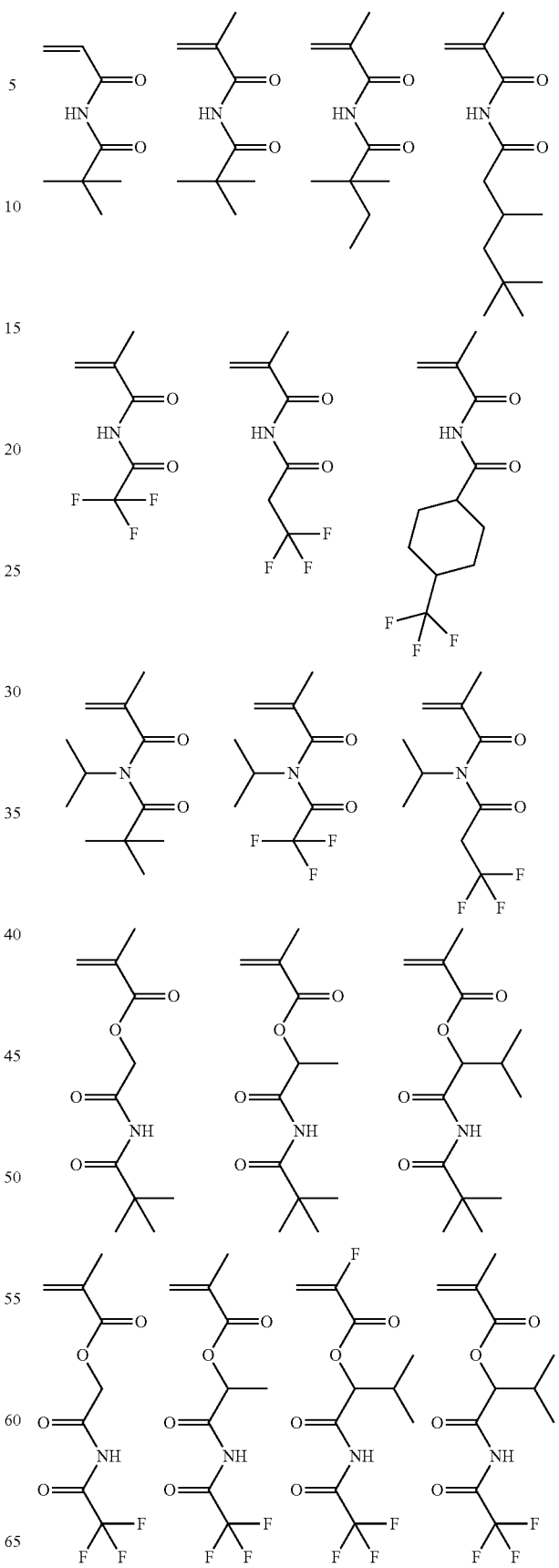

-continued
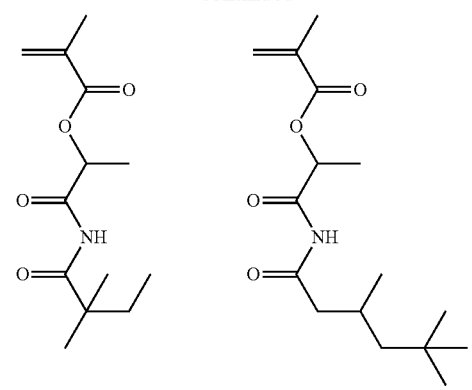
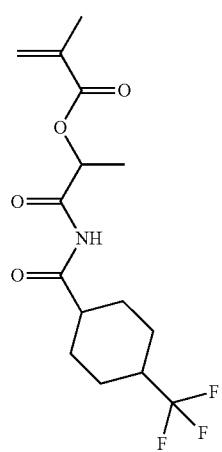
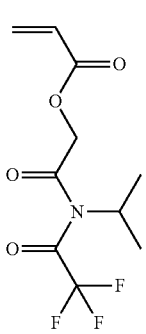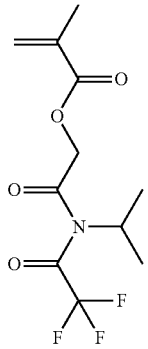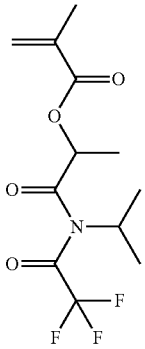
-continued
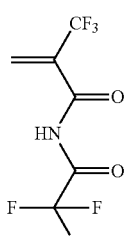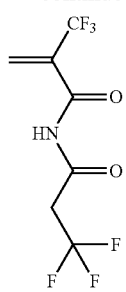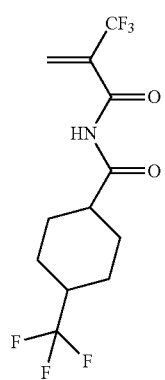
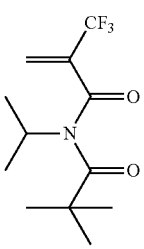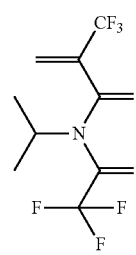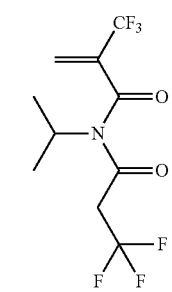
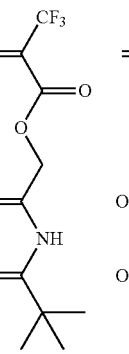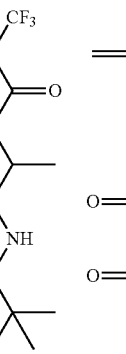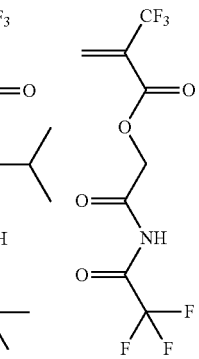
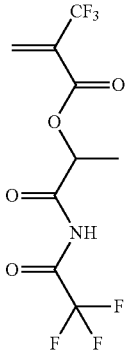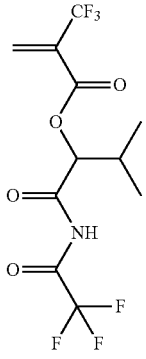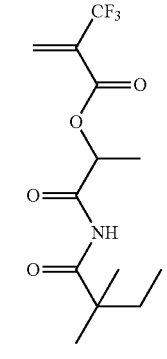

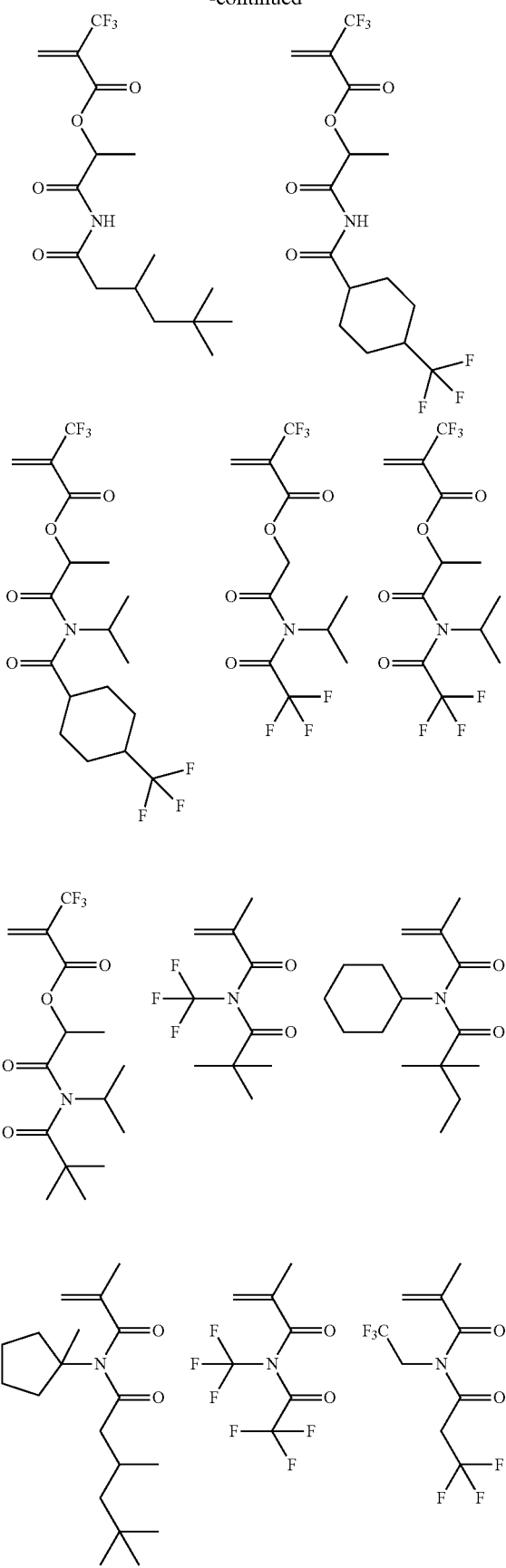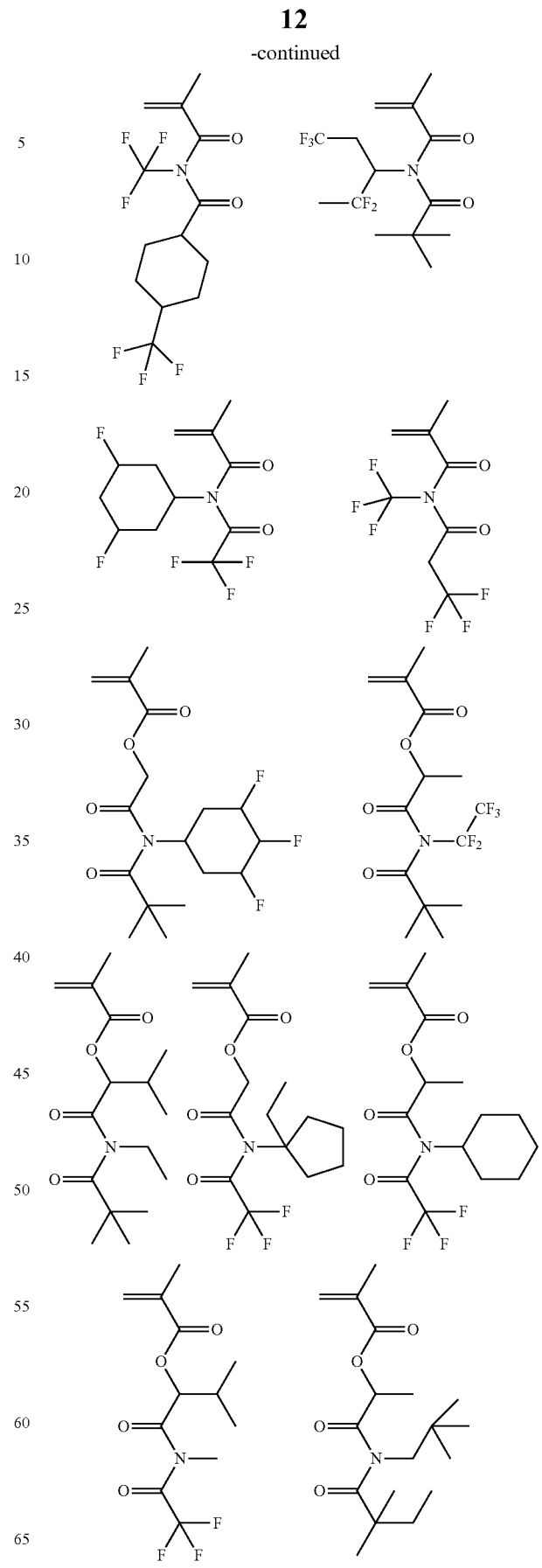

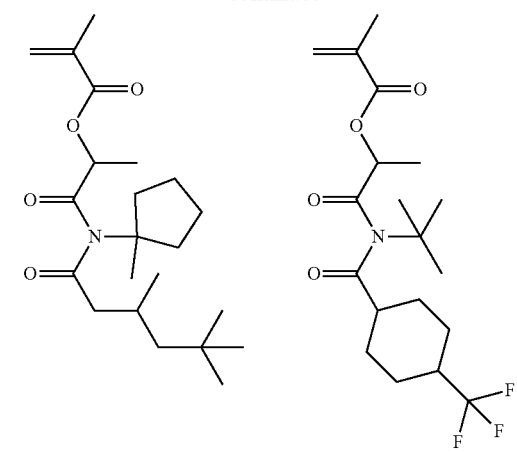
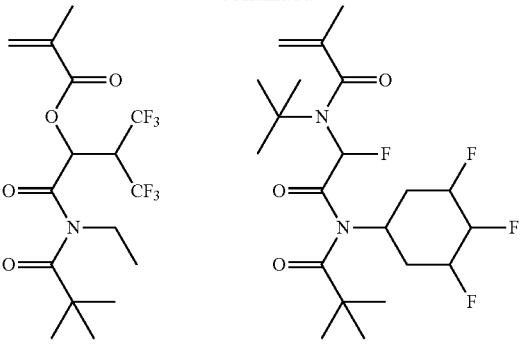
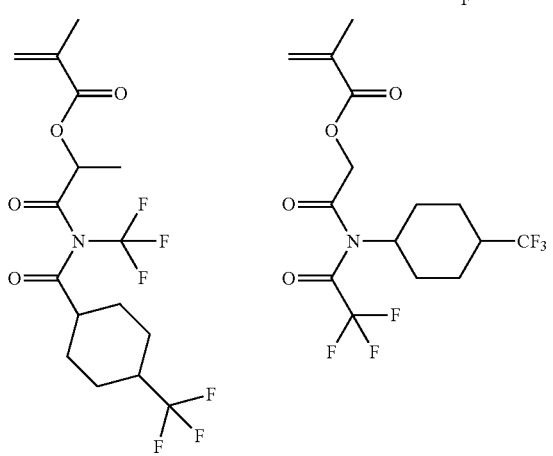
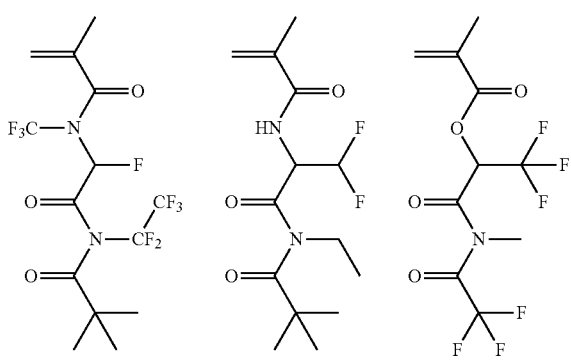
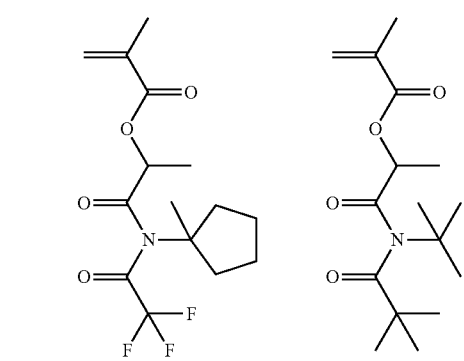
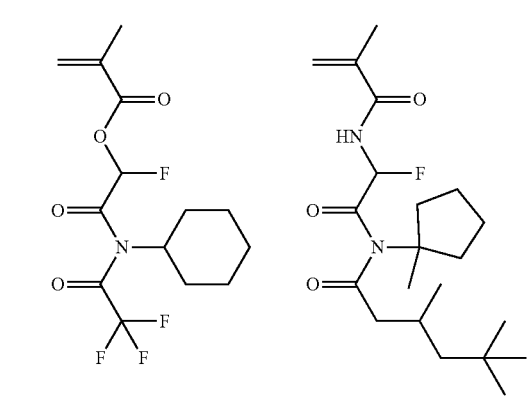
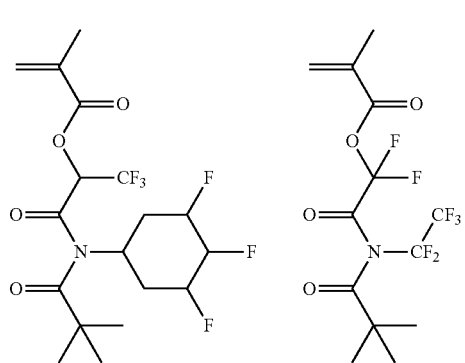
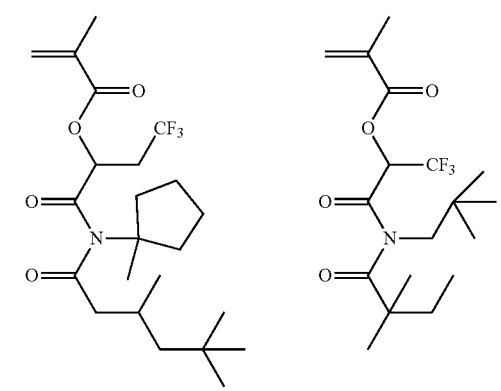

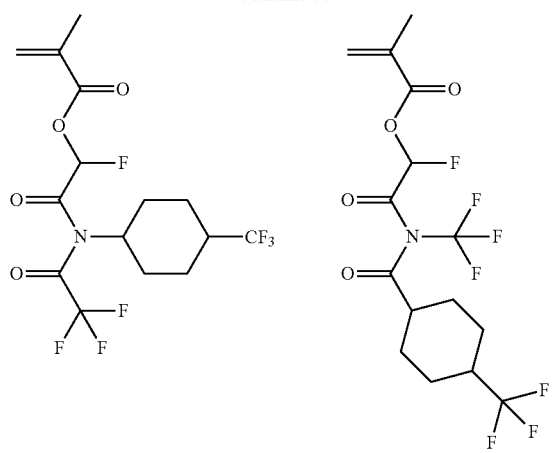
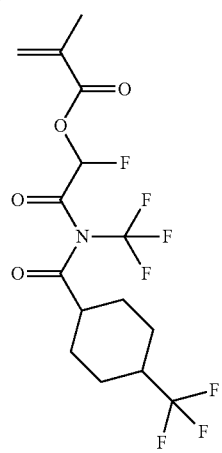
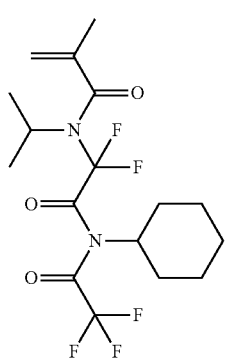
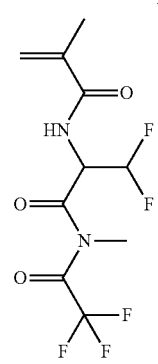
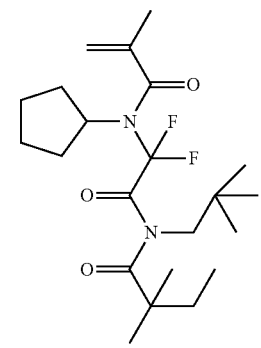
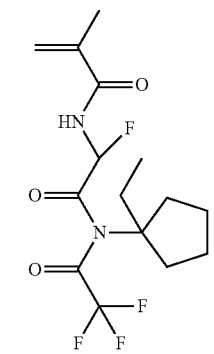
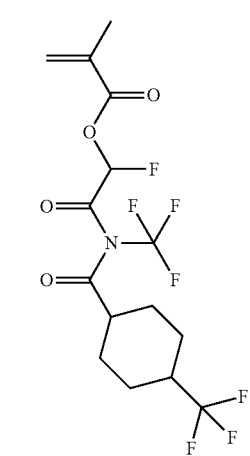
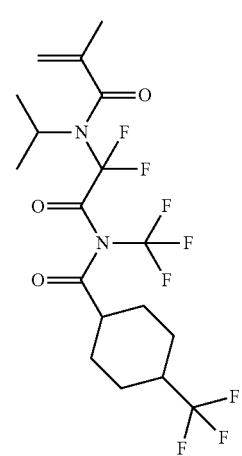
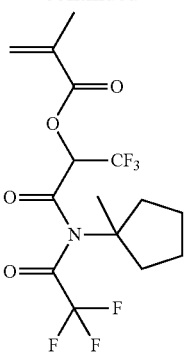
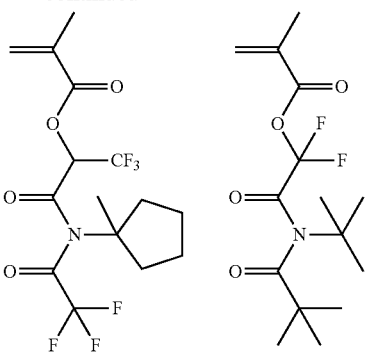
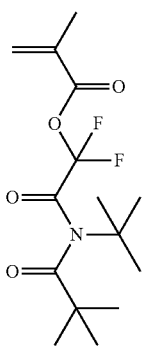
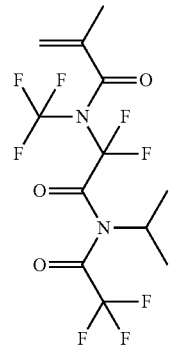
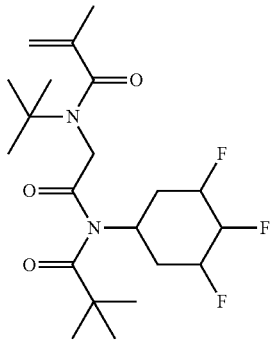
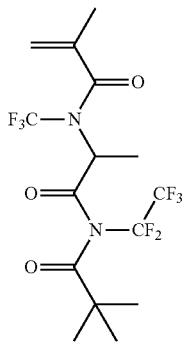
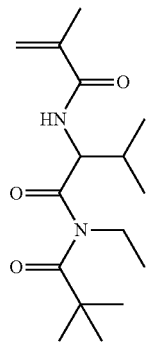
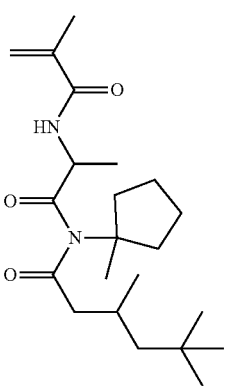
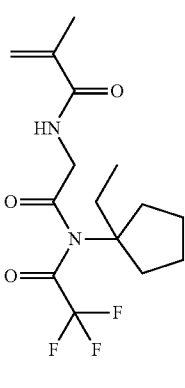

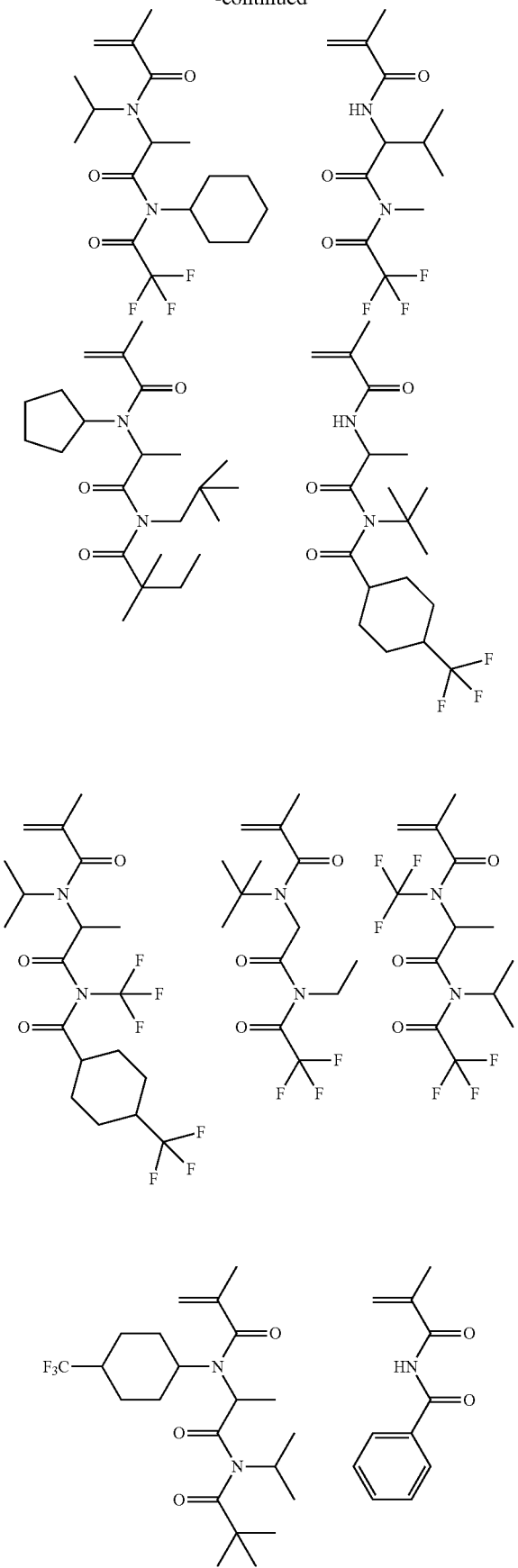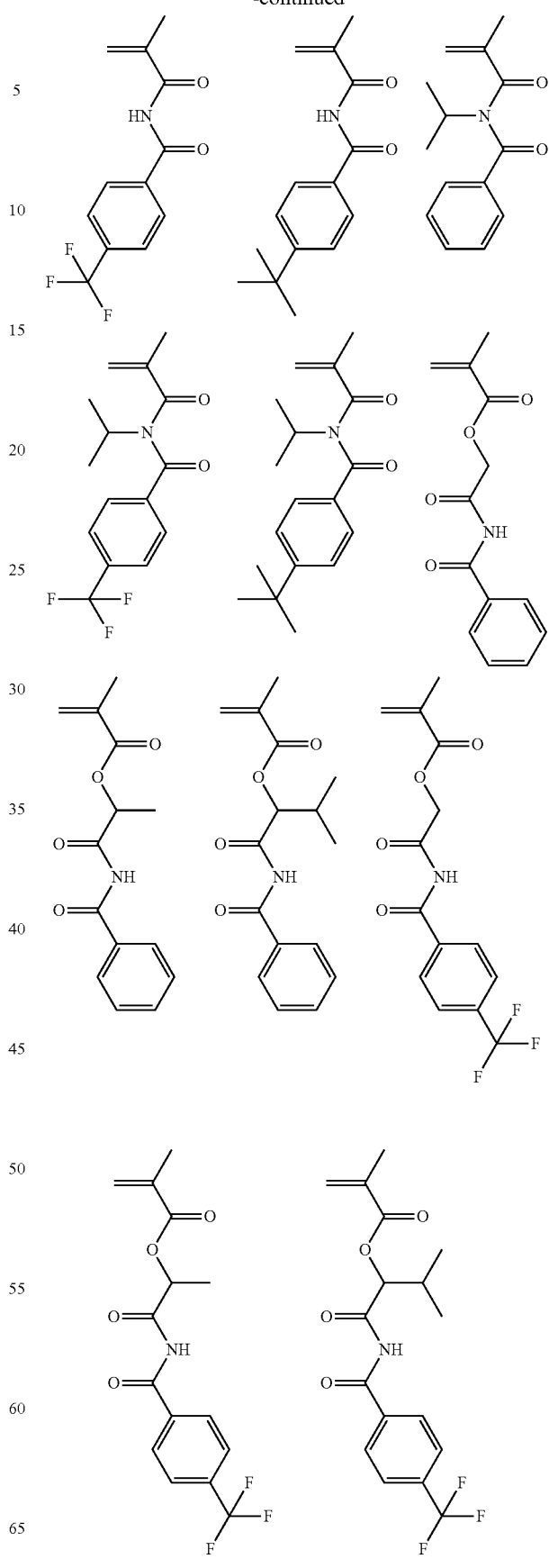

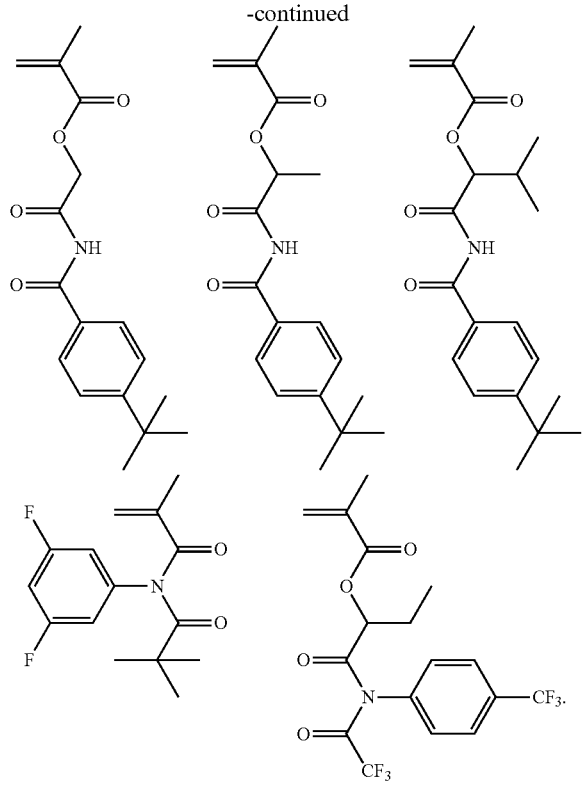

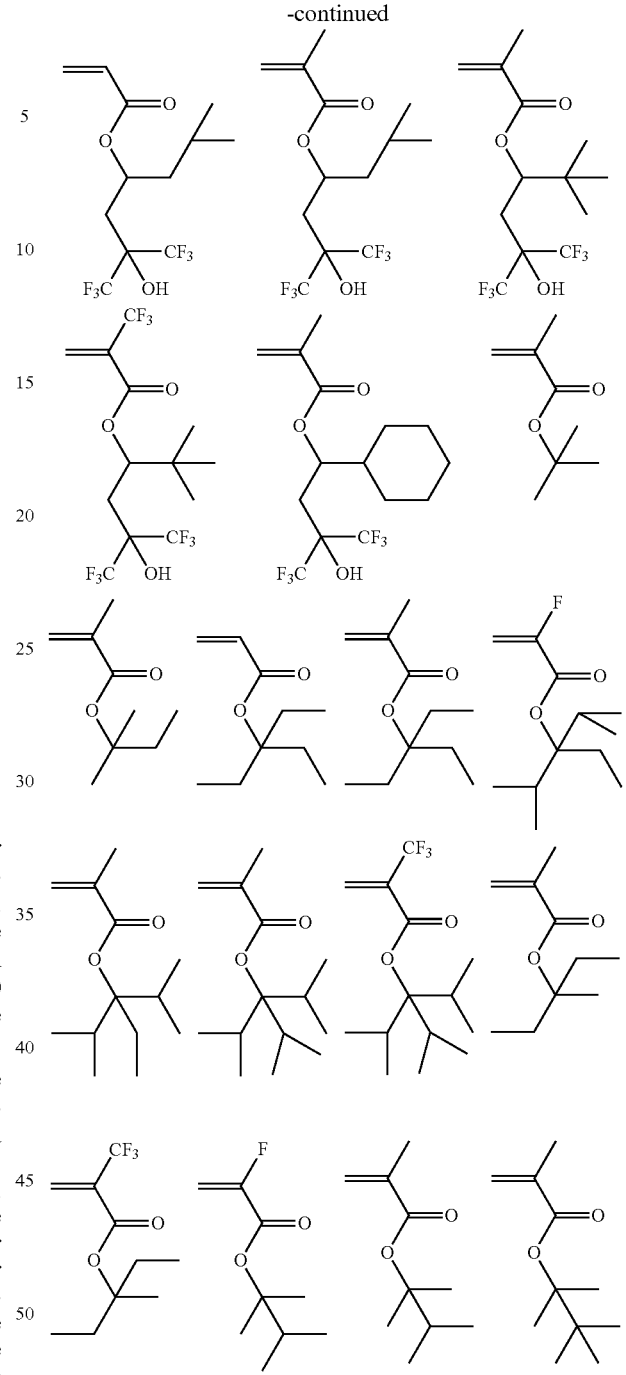

The surface active polymer can be a homopolymer formed from a monomer of general formula (I) or, alternatively can be a copolymer comprising one or more additional units. In the case of a copolymer, polymerized units of the monomer of general formula (I) are typically present in an amount of from 50 to 99 mol %, for example, from 55 to 90 mol % or from 60 to 80 mol %, based on the surface active polymer.

Suitable additional types of units that can be used in the surface active polymer include, for example, those containing one or more group chosen from fluoroalcohol, acid labile, base labile, sulfonamide, alkyl and ester groups. Preferably, such acid labile, base labile, sulfonamide, alkyl and ester groups are fluorinated. Of these, the surface active polymer preferably comprises one or more acid labile or base labile groups to enhance solubility in a developer solution after exposure to activating radiation and post-exposure baking. Exemplary additional units for use in the surface active additive polymer in accordance with the invention include polymerized units of one or more of the following monomers:

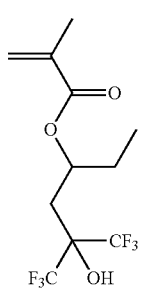
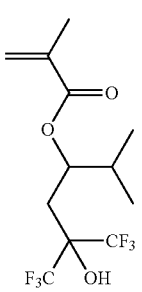
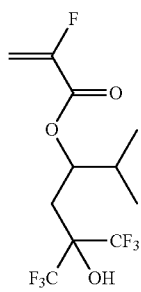
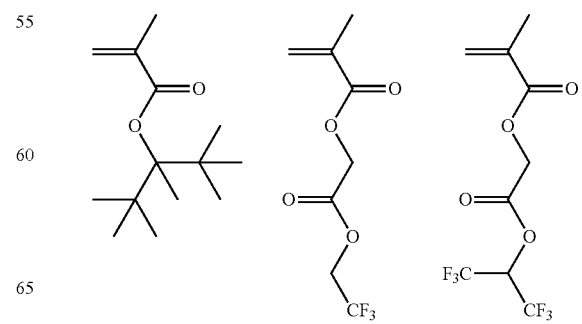

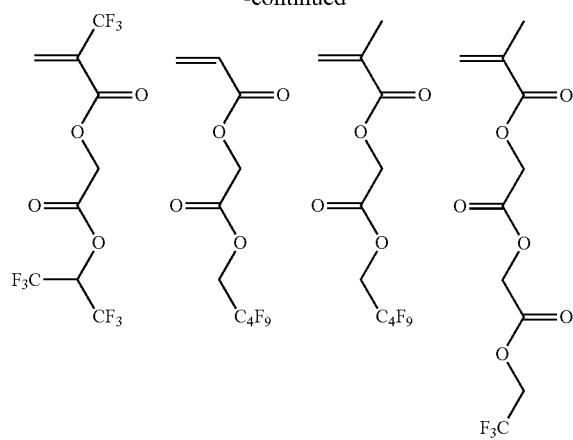
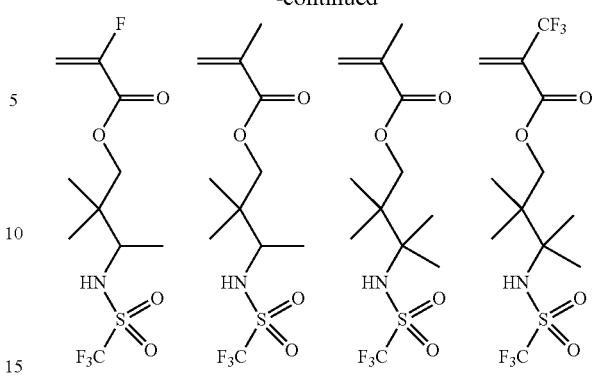
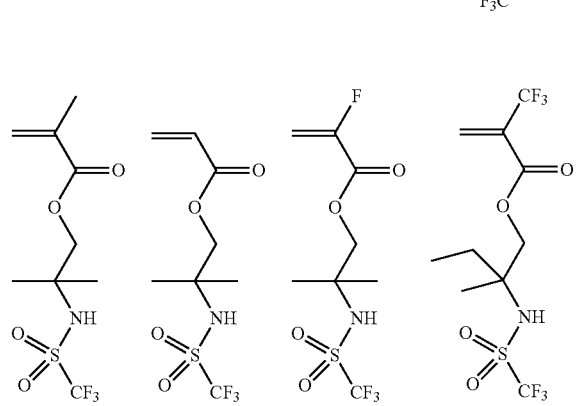
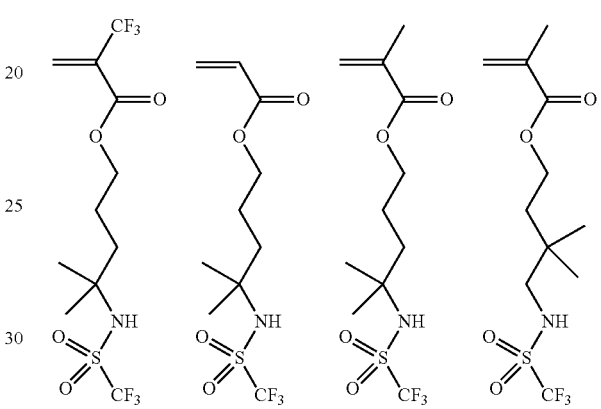
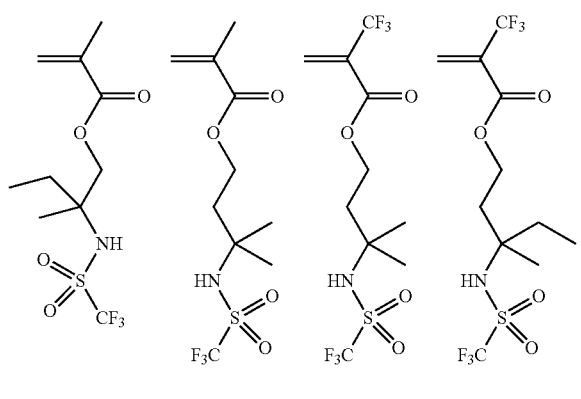
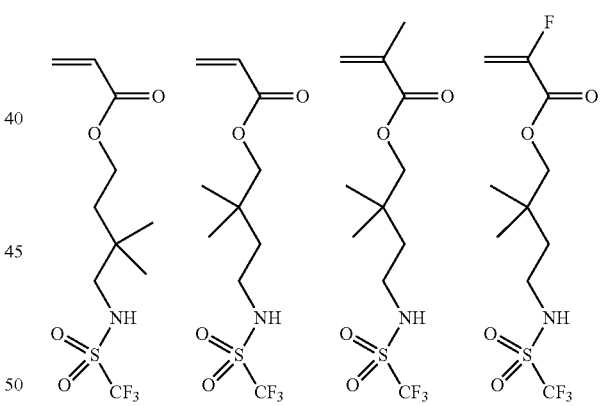
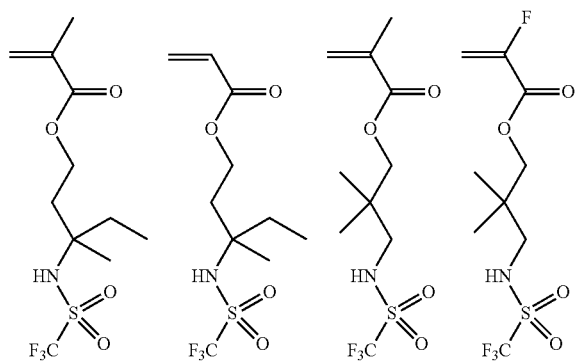
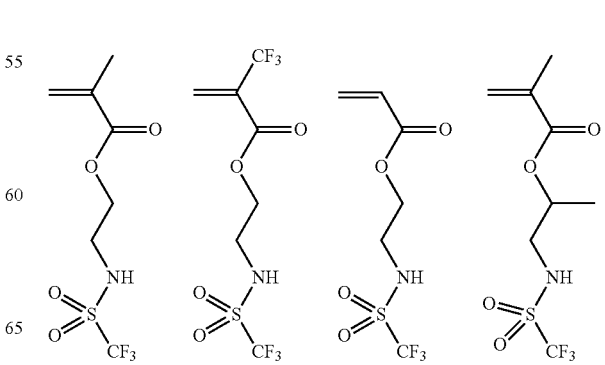

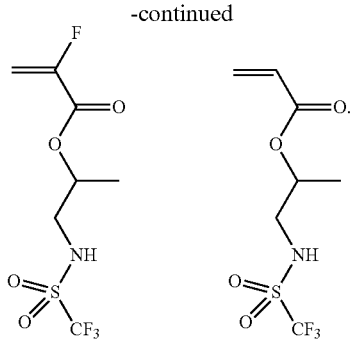
Exemplary polymers useful as the surface active polymer include, for example, the following:
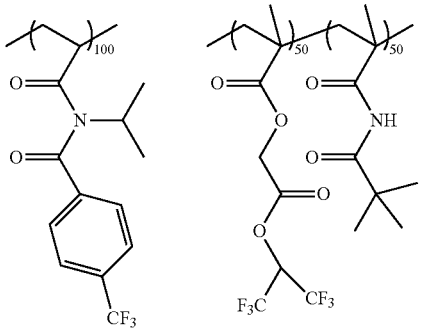
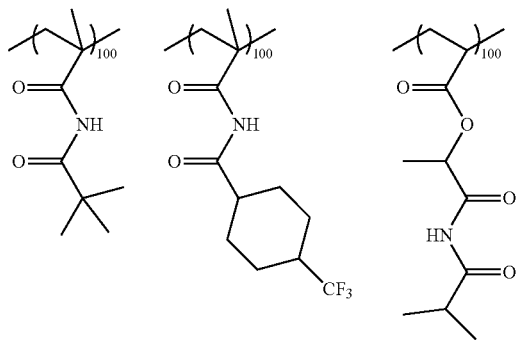
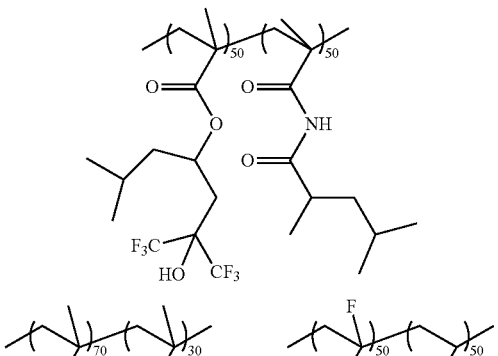
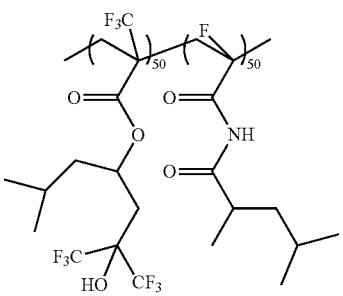
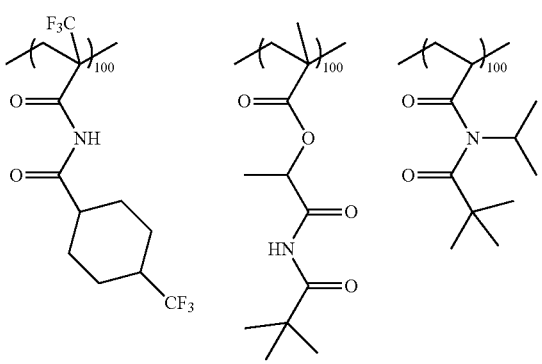
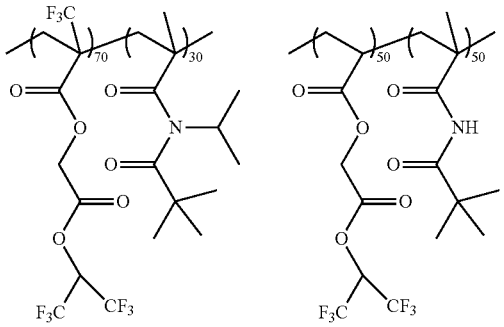

-continued
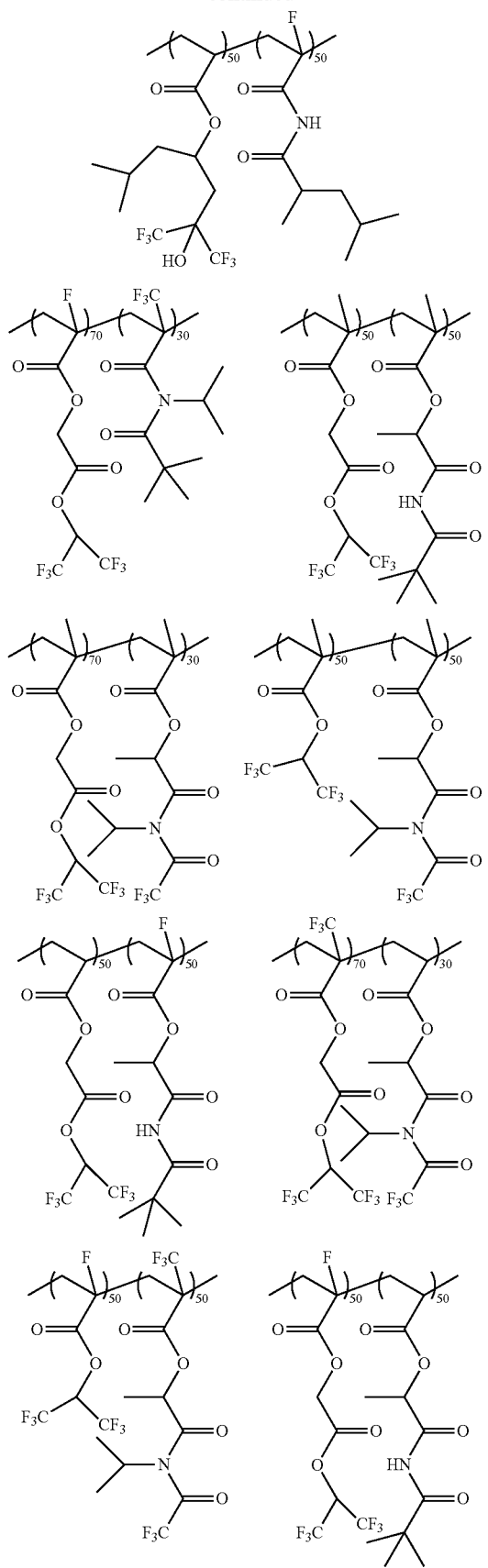
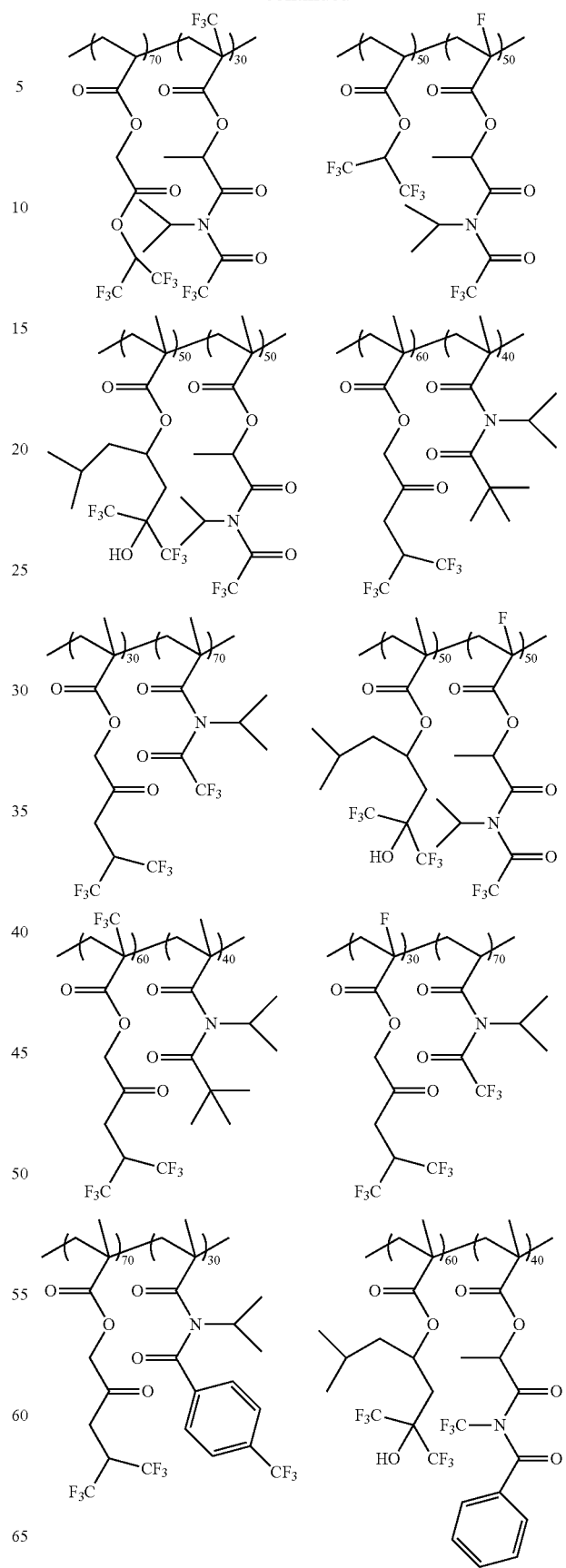

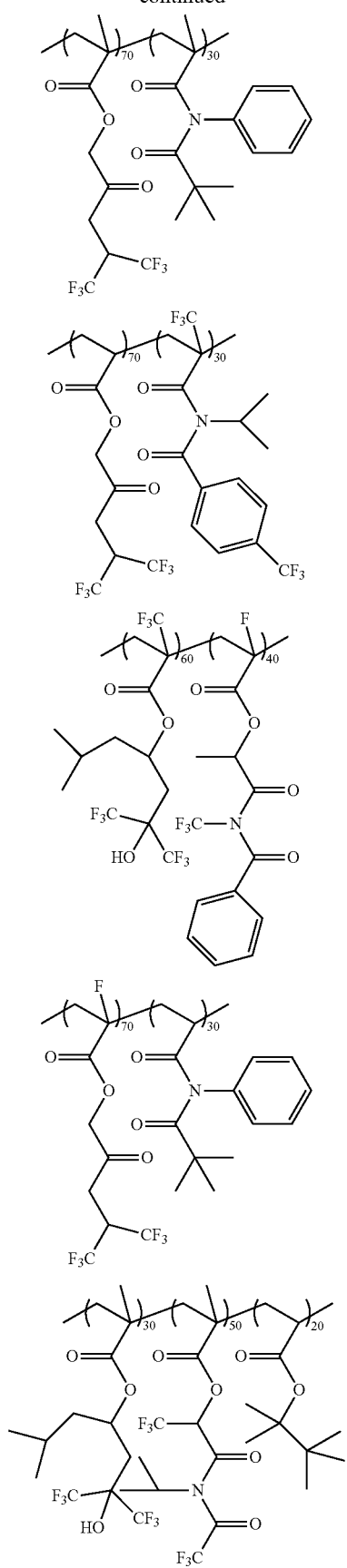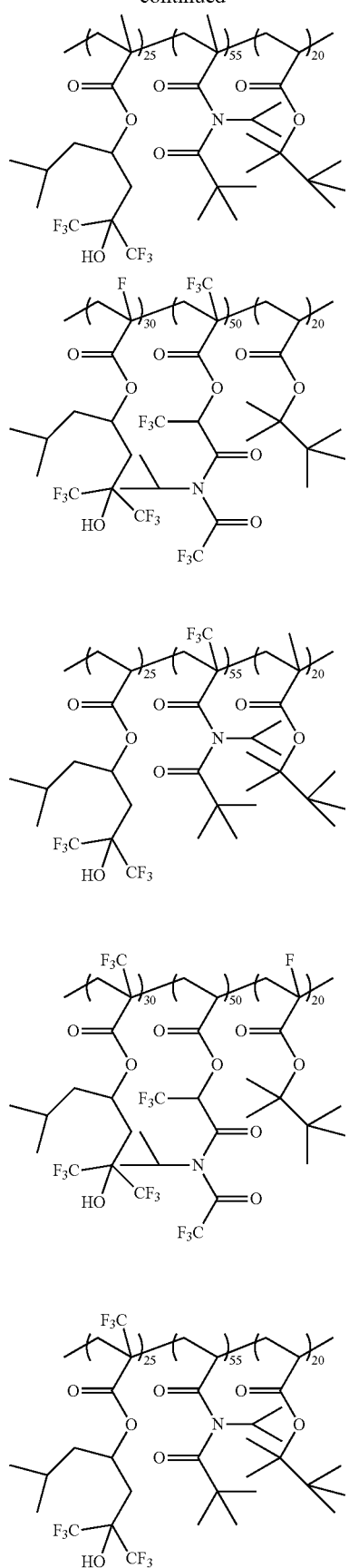

-continued

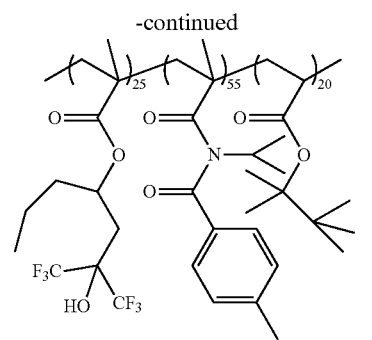

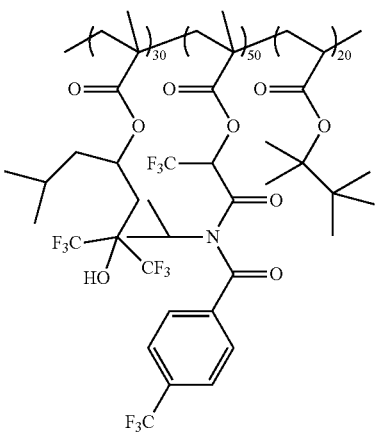

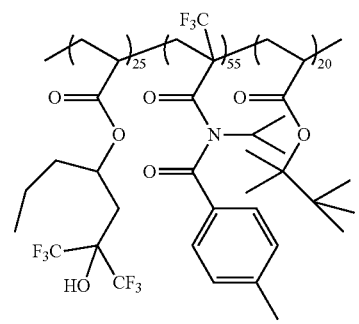

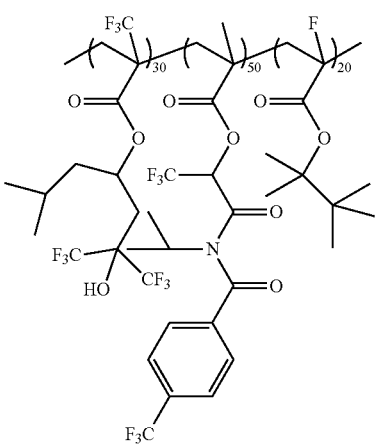

-continued

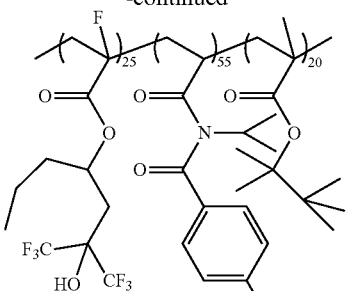

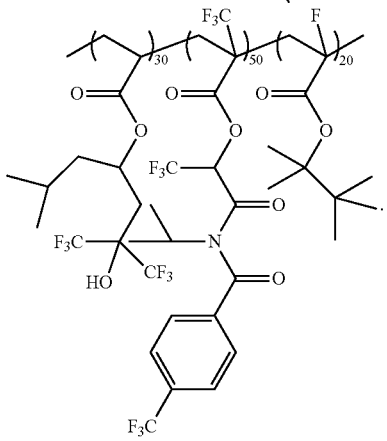

The surface active polymer lower limit for immersion lithography is generally dictated by the need to prevent leaching of the photoresist components. The surface active polymer is typically present in the compositions in an amount of from 1 to 30 wt %, more typically from 3 to 20 wt % or 5 to 15 wt %, based on total solids of the topcoat composition. The weight average molecular weight Mw of the additive polymer is typically less than 400,000, preferably from 5000 to 50,000, more preferably from 5000 to 25,000 Daltons.

Optionally, one or more additional polymers can be used in the topcoat compositions, for example, to further tune one or more characteristic of the topcoat layer.

Typical solvent materials to formulate and cast a topcoat are any which dissolve or disperse the components of the topcoat composition but do not appreciably dissolve an underlying photoresist layer. More particularly, suitable solvents to formulate a topcoat composition include one or more of, but are not limited to, alcohols such as n-butanol, alkylene glycols, such as propylene glycol. Additionally or alternatively, non-polar solvents such as aliphatic and aromatic hydrocarbons, and alkyl ethers such as dodecane, isooctane and isopentyl ether may be used. Preferably, a mixture of different solvents, for example, two, three or more solvents, can be used to achieve effective phase separation of the segregating, first additive polymer from other polymer(s) in the composition and to reduce the viscosity of the formulation which allows for reduction in the dispense volume.

In an exemplary aspect, a two-solvent system or a three-solvent system can be used in the topcoat compositions of the invention. The solvent system can include, for example, a primary solvent and an additive solvent and may include a thinner solvent. The primary solvent typically exhibits excellent solubility characteristics with respect to the non-solvent components of the topcoat composition. While the desired boiling point of the primary solvent will depend on the other components of the solvent system, the boiling point is typically less than that of the additive solvent, with a boiling point of from 120 to 140° C. such as about 130° C. being typical. Suitable primary solvents include, for example, C4 to C8 n-alcohols, such as n-butanol, isobutanol, 2-methyl-1-butanol, isopentanol, 2,3-dimethyl-1-butanol, 4-methyl-2-pentanol, isohexanol and isoheptanol, isomers thereof and mixtures thereof. The primary solvent is typically present in an amount of from 30 to 80 wt % based on the solvent system.

The additive solvent is present to facilitate phase separation between the surface active polymer and other polymer (s) in the topcoat composition to facilitate a self-segregating topcoat structure. In addition, the higher boiling point additive solvent can reduce the tip drying effect during coating. It is typical for the additive solvent to have a higher boiling point than the other components of the solvent system. While the desired boiling point of the additive solvent will depend on the other components of the solvent system, a boiling point of from 170 to 200° C. such as about 190° C. is typical. Suitable additive solvents include, for example, hydroxy alkyl ethers. Exemplary hydroxy alkyl ethers include dialkyl glycol mono-alkyl ethers and isomers thereof, for example, diethylene glycol monomethyl ether, dipropylene glycol monomethyl ether, isomers thereof and mixtures thereof. The additive solvent is typically present in an amount of from 3 to 15 wt % based on the solvent system.

A thinner solvent can optionally be used to lower the viscosity and improve coating coverage at a lower dispensing volume. The thinner solvent is typically a poorer solvent for the non-solvent components of the composition relative to the primary solvent. While the desired boiling point of the thinner solvent will depend on the other components of the solvent system, a boiling point of from 140 to 180° C. such as about 170° C. is typical. Suitable thinner solvents include, for example, alkanes such as C8 to C12 n-alkanes, for example, n-octane, n-decane and dodecane, isomers thereof and mixtures of isomers thereof; and/or alkyl ethers such as those of the formula $R_1$—O—$R_2$, wherein $R_1$ and $R_2$ are independently chosen from $C_2$ to $C_8$ alkyl, $C_2$ to $C_6$ alkyl and $C_2$ to $C_4$ alkyl. The alkyl ether groups can be linear or branched, and symmetric or asymmetric. Particularly suitable alkyl ethers include, for example, isobutyl ether, isopentyl and isobutyl isohexyl, isomers thereof and mixtures thereof. Other suitable thinner solvents include, for example, propyl pentanoate, isopropyl pentanoate, isopropyl 3-methylbutanoate, isopropyl 2-methylbutanoate, isopropyl pivalate, isobutyl isobutyrate, 2-methylbutyl isobutyrate, 2-methylbutyl 2-methylbutanoate, 2-methylbutyl 2-methylhexanoate, 2-methylbutyl heptanoate, hexyl heptanoate, n-butyl n-butyrate, isoamyl n-butyrate and isoamyl isovalerate. The thinner solvent if used is typically present in an amount of from 10 to 70 wt % based on the solvent system.

Particularly suitable three-solvent systems include 4-methyl-2-pentanol/isopentyl ether/dipropylene glycol monomethyl ether and 4-methyl-2-pentanol/isobutyl isobutyrate/dipropyleneglycol methyl ether. One or more additional solvents may be used in the solvent system, for example, one or more additional primary solvent, thinner solvent, additive solvent and/or other solvent may be employed.

The topcoat compositions of the invention may comprise one or more other optional components, for example, an acid generator compound such as a photoacid generator (PAG) compound. Suitable photoacid generators are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl) sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy) benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4, 6-bis(trichloromethyl)-1,3,5-triazine, and 2-(4-methoxynaphthyl)-4,6-bis(trichloromethyl)-1,3,5-triazine. One or more of such PAGs can be used.

If employed, the one or more acid generator may be utilized in relatively small amounts in a topcoat composition, for example, 0.1 to 8 wt %, such as about 2 wt %, based on total solids of the composition. Such use of one or more acid generator compounds may favorably impact lithographic performance, particularly resolution, of the developed image patterned in an underlying resist layer. The topcoat compositions can optionally be free of photoacid generators.

When used in immersion lithography, preferred topcoat layer compositions will have a refractive index between that of the immersion fluid and that of the photoresist at the target exposure wavelength. Preferred topcoat composition layers typically have an index of refraction of 1.4 or greater, preferably 1.47 or greater, at 193 nm. For any particular system, the index of refraction can be tuned by changing the composition of one or more polymers of the topcoat composition, including by altering the ratio of components of a polymer blend, or composition of any of the polymer(s) of a topcoat composition. For instance, increasing the amount of organic content in a topcoat layer composition can provided increased refractive index of the layer.

The topcoat compositions of the invention may be suitably prepared by admixture of the polymers and optional components into one or more polar solvents such as those identified above or alternatively one or more non-polar solvents such as the aliphatic and aromatic hydrocarbons identified above. The viscosity of the entire composition is typically from 1.5 to 2 centipoise (cp).

Photoresist Compositions

Photoresist compositions useful in the invention include, for example, chemically-amplified photoresist compositions comprising a matrix resin that is acid-sensitive, meaning that as part of a layer of the photoresist composition, the resin and composition layer undergo a change in solubility in an organic developer as a result of reaction with acid generated by a photoacid generator following soft bake, exposure to activating radiation and post exposure bake. The photoresist composition can be positive acting or negative acting. The change in solubility is brought about when acid-cleavable leaving groups such as photoacid-labile ester or acetal groups in the matrix polymer undergo a photoacid-promoted deprotection reaction on exposure to activating radiation and heat treatment to produce an acid or an alcohol group.

The matrix polymers typically include, one or more acid labile groups, one or more of polar groups (e.g., lactone, hydroxy adamantyl, hydroxy vinyl naphthalene) and one or more non-polar groups (e.g., adamantyl). Preferable acid labile groups include, for example, acetal groups or ester groups that contain a tertiary non-cyclic alkyl carbon (e.g., t-butyl) or a tertiary alicyclic carbon (e.g., methyladamantyl) covalently linked to a carboxyl oxygen of an ester of the matrix polymer. Suitable matrix polymers further include polymers that contain (alkyl)acrylate units, preferably including acid-labile (alkyl)acrylate units, such as t-butyl acrylate, t-butyl methacrylate, methyl adamantyl acrylate, methyl adamantyl methacrylate, ethylfenchyl acrylate, ethylfenchyl methacrylate, and the like, and other non-cyclic alkyl and alicyclic (alkyl)acrylates. For imaging at certain sub-200 nm wavelengths such as 193 nm, the matrix polymer is typically substantially free (e.g., less than 15 mole %) or completely free of phenyl, benzyl or other aromatic groups where such groups are highly absorbing of the radiation.

Suitable matrix polymers for use in the photoresist compositions are commercially available and can readily be made by persons skilled in the art. The matrix polymer is present in the resist composition in an amount sufficient to render an exposed coating layer of the resist developable in a suitable developer solution. Typically, the matrix polymer is present in the composition in an amount of from 50 to 95 wt % based on total solids of the resist composition. The weight average molecular weight $M_w$ of the matrix polymer is typically less than 100,000, for example, from 5000 to 100,000, more typically from 5000 to 15,000 Daltons.

The photoresist composition further comprises a photoacid generator (PAG) employed in an amount sufficient to generate a latent image in a coating layer of the composition upon exposure to activating radiation. For example, the photoacid generator will suitably be present in an amount of from about 1 to 20 wt % based on total solids of the photoresist composition. Typically, lesser amounts of the PAG will be suitable for chemically amplified resists as compared with non-chemically amplified materials. Suitable PAGs are known in the art of chemically amplified photoresists.

Suitable solvents for the photoresist compositions include, for example: glycol ethers such as 2-methoxyethyl ether (diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; Cellosolve esters such as methyl Cellosolve acetate; aromatic hydrocarbons such as toluene and xylene; and ketones such as acetone, methylethyl ketone, cyclohexanone and 2-heptanone. A blend of solvents such as a blend of two, three or more of the solvents described above also are suitable. The solvent is typically present in the composition in an amount of from 90 to 99 wt %, more typically from 95 to 98 wt %, based on the total weight of the photoresist composition.

The photoresist compositions can further include other optional materials. For example, the compositions can include one or more of added bases, actinic and contrast dyes, anti-striation agents, plasticizers, speed enhancers, sensitizers, and the like. Such optional additives if used are typically present in the composition in minor amounts such as from 0.1 to 10 wt % based on total solids of the photoresist composition.

The photoresists can be prepared following known procedures. For example, the resists can be prepared as coating compositions by dissolving the components of the photoresist in a suitable solvent. The desired total solids content of the photoresist will depend on factors such as the particular polymers in the composition, final layer thickness and exposure wavelength. Typically, the solids content of the photoresist varies from 1 to 10 wt %, more typically from 2 to 5 wt %, based on the total weight of the photoresist composition.

Lithographic Processing

Photoresist compositions can be applied to a substrate such as by spin coating, dipping, roller coating or other conventional coating technique, with spin coating being typical. When spin coating, the solids content of the coating solution can be adjusted to provide a desired film thickness based upon the specific spinning equipment utilized, the viscosity of the solution, the speed of the spinner and the amount of time allowed for spinning.

Photoresist compositions used in accordance with the invention are suitably applied to substrates conventionally used in processes involving coating with photoresists. For example, the composition may be applied over silicon wafers or silicon wafers coated with one or more layers to be patterned, for example, one or more of metal, semiconductor and dielectric layers. Aluminum-aluminum oxide, gallium arsenide, ceramic, quartz, copper, glass substrates and the like may also be suitably employed. Photoresists also may be suitably applied over an antireflective layer. The photoresist composition is typically next soft-baked by heating to remove the solvent until the photoresist coating is tack free. The photoresist layer may alternatively be dried after the topcoat composition has been applied and the solvent from both the photoresist composition and topcoat composition layers substantially removed in a single thermal treatment step.

A topcoat composition of the invention can be applied over the photoresist composition by any suitable method such as described above with reference to the photoresist compositions, with spin coating being typical. The photoresist layer with topcoat composition layer is then patternwise exposed to activating radiation for the photoactive component(s) of the photoresist. In an immersion lithography system, the space between the exposure tool (particularly the projection lens) and the photoresist coated substrate is occupied by an immersion fluid, such as water optionally mixed with one or more additives such as cesium sulfate which can provide a fluid of enhanced refractive index. Typically, the immersion fluid has been treated to avoid microbubble formation.

During the exposure step (whether immersion where fluid is interposed, or non-immersion where such fluid is not interposed), the photoresist composition layer is exposed to patterned activating radiation with the exposure energy typically ranging from about 1 to 100 mJ/cm$^2$, dependent upon the exposure tool and the components of the photoresist composition. References herein to exposing a photoresist composition to radiation that is activating for the photoresist indicates that the radiation is capable of forming a latent image in the photoresist such as by causing a reaction of the photoactive component, for example, producing photoacid from a photoacid generator compound.

The photoresist composition (and topcoat composition if photosensitive) is typically photoactivated by a short exposure wavelength, for example, radiation having a wavelength of less than 300 nm such as 248 nm, 193 nm and EUV wavelengths. Following exposure, the layer of the composition is typically baked at a temperature of from 70° C. to 160° C. and a time of from 15 seconds to 2 minutes, for example, from 30 to 90 seconds.

Thereafter, the film is developed, typically by treatment with an aqueous base developer chosen from: quaternary ammonium hydroxide solutions such as aqueous tetra-alkyl ammonium hydroxide solutions, typically a 2.38 wt % or 5 wt % tetramethylammonium hydroxide aqueous solution; amine solutions such as ethyl amine, n-propyl amine, diethyl amine, di-n-propyl amine, triethyl amine, or methyldiethyl amine; alcohol amines such as diethanol amine or triethanol amine; and cyclic amines such as pyrrole or pyridine. In general, development is in accordance with procedures recognized in the art.

Following development of the photoresist coating over the substrate, the developed substrate may be selectively processed on those areas bared of resist, for example by etching or plating substrate areas bared of resist in accordance with procedures known in the art. After such processing, resist may be removed from the processed substrate using known stripping procedures. The following non-limiting examples are illustrative of the invention.

EXAMPLES

The following monomers were used in preparation of polymers as described below. Monomer ratios where shown are provided in weight percent (wt %) based on the respective polymer.

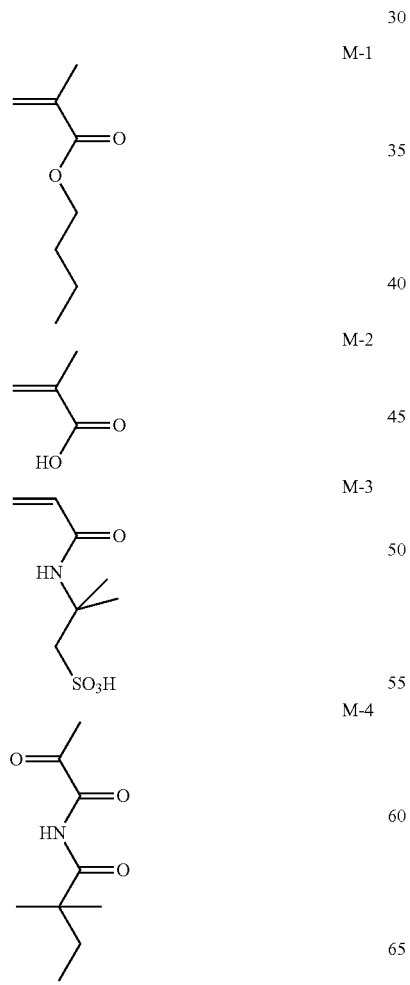

M-1

M-2

M-3

M-4

M-5

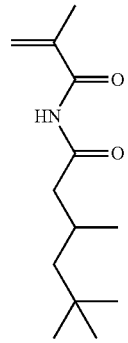

M-6

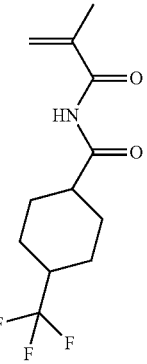

M-7

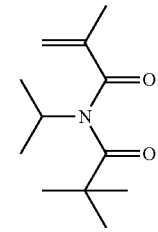

M-8

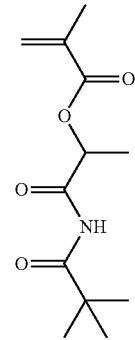

M-9

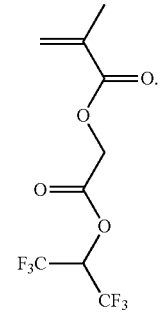

Monomer Synthesis
Synthesis of Monomers M-4-M-7

Monomers M-4-M-7 were prepared by the synthesis reaction shown in Scheme 1 described below.

Scheme 1

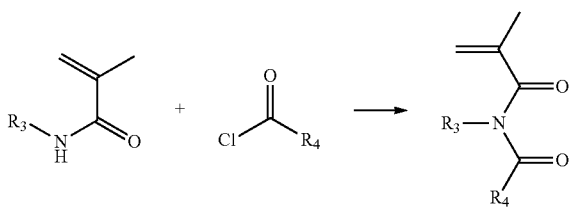

Monomer M-4 Synthesis

Methacrylamide (5 g, 0.059 mol) was dissolved in tetrahydrofuran (THF) (75 mL). 60 mL of a 1.00 mol/L lithium diisopropylamide (LiDA) solution was dropwise added thereto at 5° C., followed by stirring for 10 minutes. THF (40 mL) having 2,2-dimethylbutanoyl chloride (8.7 g, 0.065 mol) dissolved therein was then added to the solution, followed by stirring at 5° C. for 18 hours. After completion of the reaction, THF and t-butylmethylether (MTBE) were added to the solution, followed by washing with a 1 wt % aqueous hydrochloric acid solution and then distilled water. The THF/MTBE organic layer was next concentrated under reduced pressure using a rotary evaporator. N-hexane (100 mL) was added to the obtained crude product, and crystallization was conducted at 5° C. followed by filtration. The resulting solid was dried under reduced pressure to provide 6.6 g (62% yield) of N-methacryloyl-2,2-dimethylbutanamide (Monomer M-4). [$^1$H NMR (CDCl$_3$, 300 MHz): δ 0.9 (t, 3H), 1.21 (s, 6H), 1.60 (q, 2H), 1.99 (s, 3H), 5.5 (s, 1H), 5.61 (s, 1H), 8.25 (bs, 1H)].

Monomer M-5 Synthesis

Methacrylamide (10 g, 0.117 mol) was dissolved in tetrahydrofuran (THF) (150 mL). 133 mL of a 1.00 mol/L lithium diisopropylamide (LiDA) solution was dropwise added thereto at 5° C., followed by stirring for 10 minutes. THF (80 mL) having 3,5,5-trimethylhexanoyl chloride (22.77 g, 0.129 mol) dissolved therein was then added to the solution, followed by stirring at 5° C. for 18 hours. After completion of the reaction, THF and t-butylmethylether (MTBE) were added to the solution, followed by washing with a 1 wt % aqueous hydrochloric acid solution and then distilled water. The THF/MTBE organic layer was next concentrated under reduced pressure using a rotary evaporator. N-hexane (200 mL) was added to the obtained crude product, and crystallization was conducted at 5° C. followed by filtration. The resulting solid was dried under reduced pressure to provide 18 g (68% yield) of N-methacryloyl-3,5,5-trimethylhexanamide (Monomer M-5). [$^1$H NMR (CDCl$_3$, 300 MHz): δ 0.91 (s, 9H), 1.01 (d, 3H), 1.20 (d, 2H), 1.99 (s, 3H), 2.11 (m, 1H), 2.82 (d, 2H), 5.59 (s, 1H), 5.79 (s, 1H), 8.18 (bs, 1H)].

Monomer M-6 Synthesis

Methacrylamide (7.3 g, 0.086 mol) was dissolved in tetrahydrofuran (THF) (150 mL). 98 mL of a 1.00 mol/L lithium diisopropylamide (LiDA) solution was dropwise added thereto at 5° C., followed by stirring for 10 minutes. THF (80 mL) having 4-(trifluoromethyl)cyclohexane-1-carbonyl chloride (20 g, 0.093 mol) dissolved therein was then added to the solution, followed by stirring at 5° C. for 18 hours. After completion of the reaction, THF and t-butylmethylether (MTBE) were added to the solution, followed by washing with a 1 wt % aqueous hydrochloric acid solution and then distilled water. The THF/MTBE organic layer was next concentrated under reduced pressure using a rotary evaporator. N-hexane (100 mL) was added to the obtained crude product, and crystallization was conducted at 5° C. followed by filtration. The resulting solid was dried under reduced pressure to provide 12 g (53% yield) of N-methacryloyl-4-(trifluoromethyl)cyclohexane-1-carboxamide (Monomer M-6) [$^1$H NMR (CDCl$_3$, 300 MHz): δ 1.66 (m, 4H), 1.85 (m, 2H), 1.99 (s, 3H), 2.11 (m, 1H), 2.38 (m, 2H), 3.56 (t, 1H), 5.62 (s, 1H), 5.81 (s, 1H), 8.26 (bs, 1H)].

Monomer M-7 Synthesis

N-Isopropylmethacrylamide (10 g, 0.078 mol) was dissolved in tetrahydrofuran (THF) (150 mL). 120 mL of a 1.00 mol/L lithium diisopropylamide (LiDA) solution was dropwise added thereto at 5° C., followed by stirring for 10 minutes. THF (80 mL) having pivaloyl chloride (11.6 g, 0.086 mol) dissolved therein was then added to the solution, followed by stirring at 5° C. for 18 hours. After completion of the reaction, THF and t-butylmethylether (MTBE) were added to the solution, followed by washing with a 1 wt % aqueous hydrochloric acid solution and then distilled water. The THF/MTBE organic layer was next concentrated under reduced pressure using a rotary evaporator. N-hexane (200 mL) was added to the obtained crude product, and crystallization was conducted at 5° C. followed by filtration. The resulting solid was dried under reduced pressure to provide 12 g (72% yield) of N-isopropyl-N-pivaloylmethacrylamide (monomer M-7) [$^1$H NMR (CDCl$_3$, 300 MHz): δ 1.23 (s, 9H), 1.32 (d, 6H), 2.00 (s, 3H), 4.31 (m, 1H), 5.43 (s, 2H)].

Synthesis of Monomer M-8

Monomer M-8 was prepared by the synthesis reaction shown in Scheme 2 described below.

Scheme 2

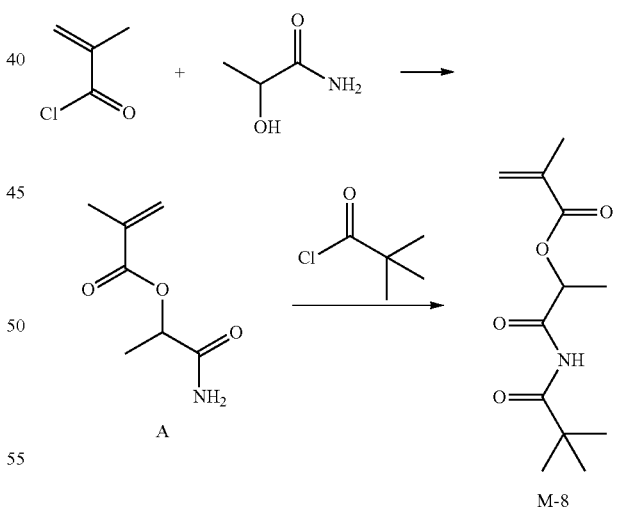

Sodium carbonate (37.5 g) was added to a solution of lactamide (22.5 g) in benzene (150 mL) and the mixture was stirred. Methacrylyl chloride (20 g) was slowly added to the mixture and the resulting reaction mixture was stirred overnight. The mixture was filtered and concentrated to a thick syrup using a rotary evaporator. Heptane was added to the thick syrup, and the syrup crystallized to a white solid α-methacryloxy propionamide (A) in a 50% yield. α-methacryloxy propionamide (A) (5 g, 0.032 mol) was dissolved in tetrahydrofuran (THF) (75 mL). 36 mL of a 1.00 mol/L lithium diisopropylamide (LiDA) solution was dropwise added thereto at 5° C., followed by stirring for 10 minutes. THF (40 mL) having pivaloyl chloride (4.68 g, 0.035 mol) dissolved therein was then added to the solution, followed by stirring at 5° C. for 18 hours. After completion of the reaction, THF and t-butylmethylether (MTBE) were added to the solution, followed by washing with a 1 wt % aqueous hydrochloric acid solution and then distilled water. The solution was next concentrated under reduced pressure. n-Hexane was added to the obtained solution, and crystallization was conducted at 5° C. followed by filtration. The resulting solid was dried under reduced pressure to provide 5 g (65% yield) of 1-oxo-1-pivalamidopropan-2-yl methacrylate (Monomer M-8). [$^1$H NMR (CDCl$_3$, 300 MHz): δ 1.23 (s, 9H), 1.54 (d, 3H), 1.99 (s, 3H), 5.66 (m, 1H), 5.83 (s, 1H), 6.21 (s, 1H), 8.36 (bs, 1H)].

Synthesis of Monomer M-9

Monomer M-9 was prepared by the synthesis reaction shown in Scheme 3 described below.

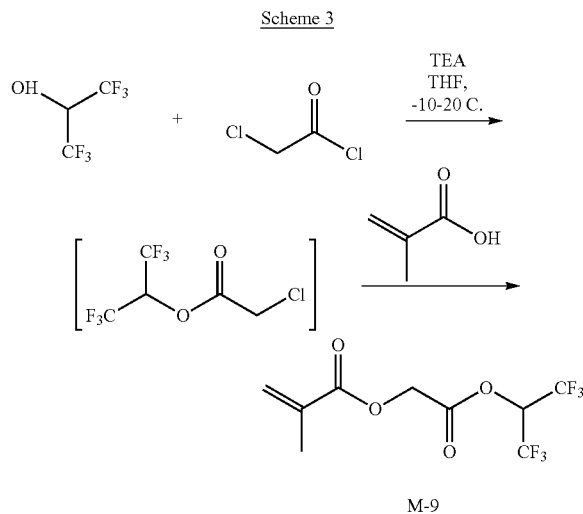

~168.04 g of hexafluoro-2-propanol, 115.24 g (98%) chloroacetyl chloride and 879 g of anhydrous ethyl acetate were added to a flask fitted with a gas inlet, temperature thermocouple, overhead stirrer and feed line. The mixture was cooled to −10 to −20° C. using a dry ice/isopropanol/water bath. 284.33 g of diisopropylethylamine was slowly added to the reaction mixture over a 90 minute period. The cooling bath was removed and the reaction mixture was allowed to cool to room temperature. Methacrylic acid (86.1 g) was then slowly added to the reaction mixture. The reaction mixture was heated to 56° C. for 6 hours and the reaction mixture was cooled to 25° C. The reaction mixture was washed with 500 mL of DI water followed by 250 mL aqueous ammonium hydroxide and 250 mL aqueous ammonium chloride. The organic layer was dried over magnesium sulfate, and the magnesium sulfate was filtered off and washed with ethyl acetate. The brown filtrate was concentrated under reduced pressure at 33-35° C., leaving 239 g of crude brown oil. The oil was vacuum distilled at 3-4 mm (bp=53° C.) using a short path one-piece distillation apparatus, yielding 191.1 g (65% yield) of Monomer-9. [$^1$H NMR (CDCl$_3$): δ 6.25-6.24 (m, 1H), 5.79 (hept, J=6 Hz, 1H), 5.73-5.69 (m, 1H), 4.87 (s, 2H), 1.99 (s, 3H). $^{13}$C NMR (CDCl$_3$): δ 166.5, 165.4, 135.1, 127.7, 120.4 (q, J=285 Hz), 67.1 (hept, J=37.5 Hz), 60.1, 18.3. $^{19}$F NMR (CDCl$_3$): δ 73.7 (d, J=6.3 Hz)].

Matrix Polymer MP-1 Synthesis

A monomer feed solution was prepared by combining 32.36 g propylene glycol monomethyl ether (PGME), 27.14 g Monomer M-1 and 11.34 g Monomer M-2 in a container and agitating the mixture to dissolve the two monomers. 1.67 g Monomer M-3 was dissolved in 5.02 g of distilled water in a container and the mixture was agitated to dissolve the monomer. The Monomer M-3 solution was added to and mixed with the Monomers M-1 and M-2 reaction mixture. An initiator feed solution was prepared by combining 0.52 g Vazo 67 free radical initiator (E. I. du Pont de Nemours and Company) and 4.65 g of PGME in a container and agitating the mixture to dissolve the initiator. 32.53 g of PGME was introduced into a reaction vessel and the vessel was purged with nitrogen gas for 30 minutes. The reaction vessel was next heated to 97° C. with agitation. Introduction of the monomer feed solution and initiator feed solution into the reaction vessel was simultaneously started. The monomer feed solution and the initiator feed solution were simultaneously fed over a period of 1.5 hours. The reaction vessel was maintained at 97° C. for an additional 4 hours with agitation, and was then allowed to cool to room temperature. Matrix polymer MP-1 was thereby formed. Weight average molecular weight (Mw) and polydispersity (PDI=Mw/Mn) were determined by polystyrene equivalent value as measured by gel permeation chromatography (GPC). [Mw=29173 Daltons, PDI=2.32].

Surface Active Polymer Synthesis

Surface active polymers were synthesized as described below and are summarized in Table 1.

Synthesis of Surface Active Polymer SAP-1 (Comp.)

A monomer solution was prepared by combining 14.73 g of propylene glycol methyl ether acetate (PGMEA), 18 g of Monomer M-9 in a flask and agitating the mixture to dissolve the monomer. An initiator feed solution was prepared by combining 0.63 g Vazo V-601 initiator (Wako Pure Chemical Industries) and 5.64 g of PGMEA in a container and agitating the mixture to dissolve the initiator. 21 g of PGMEA was introduced into a reaction vessel and the vessel was purged with nitrogen gas for 30 minutes. The reaction vessel was next heated to 99° C. with agitation. Introduction of the monomer feed solution and initiator feed solution into the reaction vessel was simultaneously started. The monomer feed solution and the initiator feed solution were simultaneously fed over a period of 110 min. The reaction vessel was maintained at 99° C. for an additional 2 hours with agitation, and was then allowed to cool to room temperature. Surface active polymer SAP-1 was thereby formed. Weight average molecular weight (Mw) and polydispersity (PDI=Mw/Mn) were determined by polystyrene equivalent value as measured by gel permeation chromatography (GPC). [Mw=6585 Daltons, PDI=1.48].

Synthesis of Surface Active Polymer SAP-2

A monomer solution was prepared by combining 22.39 g of propylene glycol methyl ether acetate (PGMEA), 4 g of Monomer M-9 and 5.82 g of Monomer M-4 in a flask and agitating the mixture to dissolve the monomers. V-601 initiator (Wako Pure Chemical Industries) (0.52 g) was added to the flask and the mixture was heated to 80° C. for 4 hours under nitrogen. The reaction mixture was allowed to cool to room temperature, resulting in surface active polymer SAP-2. Weight average molecular weight (Mw) and polydispersity (PDI=Mw/Mn) were determined by polystyrene equivalent value as measured by gel permeation chromatography (GPC). [Mw=12,600 Daltons, PDI=2.15].

Synthesis of Surface Active Polymer SAP-3

A monomer solution was prepared by combining 11.60 g of propylene glycol methyl ether acetate (PGMEA), 4 g of Monomer M-9 and 1.07 g of Monomer M-4 in a flask and agitating the mixture to dissolve the monomers. V-601 initiator (Wako Pure Chemical Industries) (0.22 g) was added to the flask and the mixture was heated to 80° C. for 4 hours under nitrogen. The reaction mixture was allowed to cool to room temperature, resulting in surface active polymer SAP-3. The copolymer compositional ratio was determined by $^1$H NMR (300 MHz). Weight average molecular weight (Mw) and polydispersity (PDI=Mw/Mn) were determined by polystyrene equivalent value as measured by gel permeation chromatography (GPC). [Mw=11800 Daltons, PDI=2.1].

Synthesis of Surface Active Polymer SAP-4

A monomer solution was prepared by combining 16.17 g of propylene glycol methyl ether acetate (PGMEA), 4 g of Monomer M-9 and 3.07 g of Monomer M-5 in a flask and agitating the mixture to dissolve the monomers. V-601 initiator (Wako Pure Chemical Industries) (0.31 g) was added to the flask and the mixture was heated to 80° C. for 4 hours under nitrogen. The reaction mixture was allowed to cool to room temperature, resulting in surface active polymer SAP-4. The copolymer compositional ratio was determined by $^1$H NMR (300 MHz). Weight average molecular weight (Mw) and polydispersity (PDI=Mw/Mn) were determined by polystyrene equivalent value as measured by gel permeation chromatography (GPC). [Mw=11,000 Daltons, PDI=2.2].

Synthesis of Surface Active Polymer SAP-5

A monomer solution was prepared by combining 10.93 g of propylene glycol methyl ether acetate (PGMEA), 4 g of Monomer M-9 and 0.77 g of Monomer M-5 in a flask and agitating the mixture to dissolve the monomers. V-601 initiator (Wako Pure Chemical Industries) (0.20 g) was added to the flask and the mixture was heated to 80° C. for 4 hours under nitrogen. The reaction mixture was allowed to cool to room temperature, resulting in surface active polymer SAP-5. The copolymer compositional ratio was determined by $^1$H NMR (300 MHz). Weight average molecular weight (Mw) and polydispersity (PDI=Mw/Mn) were determined by polystyrene equivalent value as measured by gel permeation chromatography (GPC). [Mw=20,000 Daltons, PDI=2.1].

Synthesis of Surface Active Polymer SAP-6

A monomer solution was prepared by combining 14.69 g of propylene glycol methyl ether acetate (PGMEA), 4 g of Monomer M-9 and 8.36 g of Monomer M-6 in a flask and agitating the mixture to dissolve the monomers. V-601 initiator (Wako Pure Chemical Industries) (0.42 g) was added to the flask and the mixture was heated to 80° C. for 4 hours under nitrogen. The reaction mixture was allowed to cool to room temperature, resulting in surface active polymer SAP-6. The copolymer compositional ratio was determined by $^1$H NMR (300 MHz). Weight average molecular weight (Mw) and polydispersity (PDI=Mw/Mn) were determined by polystyrene equivalent value as measured by gel permeation chromatography (GPC). [Mw=5000 Daltons, PDI=1.43].

Synthesis of Surface Active Polymer SAP-7

A monomer solution was prepared by combining 6.17 g of propylene glycol methyl ether acetate (PGMEA), 4 g of Monomer M-9 and 1.23 g of Monomer M-7 in a flask and agitating the mixture to dissolve the monomers. V-601 initiator (Wako Pure Chemical Industries) (0.22 g) was added to the flask and the mixture was heated to 80° C. for 4 hours under nitrogen. The reaction mixture was allowed to cool to room temperature, resulting in surface active polymer SAP-7. The copolymer compositional ratio was determined by $^1$H NMR (300 MHz). Weight average molecular weight (Mw) and polydispersity (PDI=Mw/Mn) were determined by polystyrene equivalent value as measured by gel permeation chromatography (GPC). [Mw=4500 Daltons, PDI=1.36].

Synthesis of Surface Active Polymer SAP-8

A monomer solution was prepared by combining 10 g of propylene glycol methyl ether acetate (PGMEA), 4 g of Monomer M-9 and 2.87 g of Monomer M-7 in a flask and agitating the mixture to dissolve the monomers. V-601 initiator (Wako Pure Chemical Industries) (0.19 g) was added to the flask and the mixture was heated to 80° C. for 4 hours under nitrogen. The reaction mixture was allowed to cool to room temperature, resulting in surface active polymer SAP-8. The copolymer compositional ratio was determined by $^1$H NMR (300 MHz). Weight average molecular weight (Mw) and polydispersity (PDI=Mw/Mn) were determined by polystyrene equivalent value as measured by gel permeation chromatography (GPC). [Mw=4200 Daltons, PDI=1.2].

Synthesis of Surface Active Polymer SAP-9

A monomer solution was prepared by combining 10.67 g of propylene glycol methyl ether acetate (PGMEA), 4 g of Monomer M-9 and 3.28 g of Monomer M-8 in a flask and agitating the mixture to dissolve the monomers. V-601 initiator (Wako Pure Chemical Industries) (0.25 g) was added to the flask and the mixture was heated to 80° C. for 4 hours under nitrogen. The reaction mixture was allowed to cool to room temperature, resulting in surface active polymer SAP-9. The copolymer compositional ratio was determined by $^1$H NMR (300 MHz). Weight average molecular weight (Mw) and polydispersity (PDI=Mw/Mn) were determined by polystyrene equivalent value as measured by gel permeation chromatography (GPC). [Mw=7000 Daltons, PDI=1.54].

TABLE 1

| Polymer | M-4 | M-5 | M-6 | M-7 | M-8 | M-9 | Mw | PDI |
|---|---|---|---|---|---|---|---|---|
| SAP-1 | | | | | | 100 | 6585 | 1.48 |
| SAP-2 | 70 | | | | | 30 | 12,600 | 2.15 |
| SAP-3 | 30 | | | | | 70 | 11,800 | 2.1 |
| SAP-4 | | 46 | | | | 54 | 11,000 | 2.2 |
| SAP-5 | | 20 | | | | 80 | 20,000 | 2.1 |
| SAP-6 | | | 36 | | | 64 | 5000 | 1.43 |
| SAP-7 | | | | 30 | | 70 | 4500 | 1.36 |
| SAP-8 | | | | 43 | | 57 | 4200 | 1.2 |
| SAP-9 | | | | | 50 | 50 | 7000 | 1.54 |

All polymerized units provided as wt % based on polymer;
Mw in Daltons;
PDI = Mw/Mn.

Topcoat Composition Preparation

Topcoat Compositions TC-1-TC-9 were formulated by adding Matrix Polymer MP-1 (3.606 g), Surface Active Polymers SAP-1~SAP-9 (0.049 g) and (4-(2-(tert-butoxy)-2-oxoethoxy)phenyl)diphenylsulfonium 1,1,2,2,3,3,4,4,4-nonafluorobutane-1-sulfonate (0.205 g of 1 wt % solution in 4-methyl-2-pentanol) to a solvent system of 4-methyl-2-pentanol (15.860 g), isobutyl isobutyrate (9.159 g) and dipropyleneglycol methyl ether (1.326 g). The mixture was filtered through 0.2 μm PTFE disk. The polymers of the topcoat compositions are summarized in Table 2.

TABLE 2

| Example | TC | MP | SAP |
|---|---|---|---|
| 1 (Comp.) | TC-1 | MP-1 | SAP-1 |
| 2 | TC-2 | MP-1 | SAP-2 |
| 3 | TC-3 | MP-1 | SAP-3 |
| 4 | TC-4 | MP-1 | SAP-4 |
| 5 | TC-5 | MP-1 | SAP-5 |
| 6 | TC-6 | MP-1 | SAP-6 |
| 7 | TC-7 | MP-1 | SAP-7 |
| 8 | TC-8 | MP-1 | SAP-8 |
| 9 | TC-9 | MP-1 | SAP-9 |

TC = Topcoat Composition; MP = Matrix Polymer; SAP = Surface Active Polymer.

Topcoat Composition Characterization
Contact Angle Measurement 200 mm silicon wafers were primed with HMDS at 120° C. for 30 seconds and coated on a TEL ACT-8 wafer track with EPIC™ 2096 positive photoresist (Rohm and Haas Electronic Materials) to a thickness of 1200 Å on primed silicon. Topcoat Compositions TC-1-TC-9 were coated on the resist-coated wafers to a thickness of 385 Å and then baked at 90° C. for 60 seconds on the same wafer track. Static contact angle (SCA), receding contact angle (RCA), advancing contact angle (ACA) and sliding angle (SA) with respect to DI water were measured for each sample. Static and dynamic contact angles were measured using a KRUSS drop shape analyzer model 100. For dynamic contact angle measurement, the droplet size of DI water was 50 µl (microliter), and the wafer stage tilting rate was 1 unit/sec. Once a water droplet was placed on a test wafer surface, tilting of the wafer stage was immediately started. During wafer stage tilting, video of the droplet was taken at a rate of 20 frames per second until the droplet started to slide away from its original location. Each frame in the video was analyzed, and the image of the droplet on the frame when the droplet started to slide was used to determine the dynamic contact angles (RCA and ACA) by its corresponding tangent lines. Sliding angle was determined as the wafer stage tilting angle corresponding to the frame when the droplet started to slide. In the static contact angle measurement, the water droplet was 2.5 µL and was placed on the test wafer surface without tilting. The contact angle was determined by the tangent lines on the leading edge and trailing edge of the droplet. The reported static contact angle was the average of the contact angles from leading and trailing edges of the droplet. The results are shown in Table 3.

Dissolution Rate Measurement 200 mm silicon wafers were primed with HMDS at 120° C. for 30 seconds on a TEL ACT-8 wafer track. Wafers were coated with a solution of Matrix Polymer MP-1 in 4-methyl-2-pentanol (14 wt % solids) or with a solution of a surface active polymer in PGMEA (14 wt % solids) using a softbake at 90° C. for 60 seconds. Dissolution rates (DR) of the surface active polymers were measured with a Litho Tech Japan Corp. ARM-808EUV dissolution rate monitor at 470 nm incident wavelength in 5 wt % aqueous TMAH developer. The results are shown in Table 3.

TABLE 3

| Example | TC | SCA | RCA | ACA | SA | DR (Å/s) |
|---|---|---|---|---|---|---|
| 10 (Comp.) | TC-1 | 103.8 | 77.2 | 104.5 | 1.5 | 14 |
| 11 | TC-2 | 88.4 | 64.6 | 93.1 | 2.1 | 2.5 |
| 12 | TC-3 | 96.3 | 60.4 | 96.9 | 2.15 | 4 |
| 13 | TC-4 | 98.9 | 77.6 | 105.3 | 2.2 | 0.14 |
| 14 | TC-5 | 103.4 | 87.5 | 106.1 | 2.1 | 3.8 |
| 15 | TC-6 | 98.7 | 73.7 | 96.5 | 1.43 | 111.95 |
| 16 | TC-7 | 95.2 | 71.6 | 97.7 | 1.36 | 4 |
| 17 | TC-8 | 99.5 | 78 | 101.2 | 1.2 | 3 |
| 18 | TC-9 | 74.7 | 75.1 | 97.7 | 1.54 | 10.8 |

TC = Topcoat Composition;
SCA = static contact angle;
RCA = receding contact angle;
ACA = advancing contact angle;
SA = sliding angle;
DR = dissolution rate in 5 wt % aqueous TMAH solution.

Coating Quality Testing

On a TEL Lithius i+ Clean Track, 300 mm silicon wafers were primed with hexamethyldisilazane at 180° C. for 60 seconds. Topcoat compositions TC-1, TC-4, TC-6, TC-8 and TC-9 were spin coated on the same machine to a thickness of 385 Å on respective primed wafers. An edge bead removal step was performed to uniformly remove 5 mm width of coated film around the wafer edge. The coated films were soft baked at 90° C. for 60 seconds. The coatings were visually inspected at 10× magnification using a Nikon Eclipse L200 microscope equipped with Nikon LU Plan Fluor objectives to note any visible coating defects at the topcoat layer edge and relative surface roughness of the topcoat layer. Coating defects observed were in the form of dewets exhibited as spike-shaped discontinuities in the topcoat layer. The results are summarized in Table 4.

TABLE 4

| Example | TC | Edge Coating Defects | Surface Roughness |
|---|---|---|---|
| 19 (Comp.) | TC-1 | ~25 dewet spikes (~4 cm × 3 mm) | Rough |
| 20 | TC-4 | Two dewet spikes (~1 cm × 2 mm) | Smooth |
| 21 | TC-6 | 2-3 dewet spikes (~1-2 cm × 2-3 mm) | Smooth |
| 22 | TC-8 | None | Smooth |
| 23 | TC-9 | ~10 dewet spikes (~1-2 cm × 2-3 mm) | Smooth |

Immersion Lithography 200 mm silicon wafers are spin coated with AR™40A antireflectant (Rohm and Haas Electronic Materials) and baked for 60 seconds at 215° C. to form a 75 nm first bottom antireflective coating (BARC) layer. AR™124 antireflectant (Rohm and Haas Electronic Materials) is coated over the first BARC layer and baked at 205° C. for 60 seconds to form a 23 nm top BARC layer. The wafers are coated with EPIC™ 2096 positive photoresist (Rohm and Haas Electronic Materials) to a thickness of 1200 Å. Topcoat Compositions TC-2-TC-9 are coated on the resist-coated wafers to a thickness of 385 Å and then baked at 90° C. for 60 seconds. The wafers are exposed through a patterned photomask having contact hole patterns on an immersion scanner. The wafers are post-exposure baked at 100° C. for 60 seconds and developed for 12 seconds with 2.38 wt % aqueous TMAH developer to render contact hole patterns.

What is claimed is:

1. A topcoat composition, comprising:
   a matrix polymer;
   a surface active polymer comprising a polymerized unit formed from a monomer of the following general formula (I):

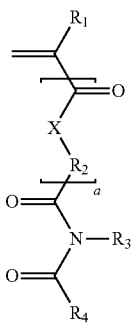

(I)

wherein: $R_1$ represents H, F, methyl, or fluorinated methyl; $R_2$ represents optionally substituted C1 to C8 alkylene or optionally substituted C1 to C8 fluoroalkylene, optionally comprising one or more heteroatom; $R_3$ represents H, F, optionally substituted C1 to C10 alkyl or optionally substituted C5 to C15 aryl, optionally comprising one or more heteroatom; $R_4$ represents optionally substituted C1 to C8 alkyl, optionally substituted C1 to C8 fluoroalkyl or optionally substituted C5 to C15 aryl, optionally comprising one or more heteroatom; X represents O, S, or $NR_5$, wherein $R_5$ is chosen from hydrogen and optionally substituted C1 to C5 alkyl; and a is 0 or 1; and a solvent.

2. The topcoat composition of claim 1, wherein a is 0.

3. The topcoat composition of claim 1, wherein a is 1.

4. The topcoat composition of claim 1, wherein $R_4$ represents C1 to C8 fluoroalkyl.

5. The topcoat composition of claim 1, wherein the surface active polymer further comprises a polymerized unit formed from a monomer comprising a base labile group, an acid labile group, or a combination thereof.

6. The topcoat composition of claim 1, wherein the topcoat composition is free of photoacid generators.

7. The topcoat composition of claim 1, further comprising a photoacid generator.

8. The topcoat composition of claim 1, wherein the surface active polymer is present in an amount of from 1 to 30 wt % based on total solids of the topcoat composition.

9. A coated substrate, comprising:
a photoresist layer on a substrate; and
a topcoat layer formed from a topcoat composition of claim 1 over the photoresist layer.

10. A pattern-forming method, comprising:
(a) forming a photoresist layer over a substrate;
(b) forming a topcoat layer over the photoresist layer, wherein the topcoat layer is formed from a topcoat composition of any of claim 1;
(c) exposing the topcoat layer and the photoresist layer to activating radiation; and
(d) contacting the exposed topcoat layer and photoresist layer with a developer to form a photoresist pattern.

11. The method of claim 10, wherein the exposing is conducted by immersion lithography.

12. The method of claim 10, wherein a is 0.

13. The method of claim 10, wherein a is 1.

14. The method of claim 10, wherein $R_4$ represents C1 to C8 fluoroalkyl.

15. The method of claim 10, wherein the surface active polymer further comprises a polymerized unit formed from a monomer comprising a base labile group, an acid labile group, or a combination thereof.

16. The method of claim 10, wherein the topcoat composition is free of photoacid generators.

17. The method of claim 10, further comprising a photoacid generator.

18. The method of claim 10, wherein the surface active polymer is present in an amount of from 1 to 30 wt % based on total solids of the topcoat composition.

* * * * *